(12) United States Patent
Cho et al.

(10) Patent No.: US 11,489,055 B2
(45) Date of Patent: Nov. 1, 2022

(54) SEMICONDUCTOR DEVICES

(71) Applicant: Samsung Electronics Co., Ltd., Suwon-si (KR)

(72) Inventors: Keun Hwi Cho, Seoul (KR); Soonmoon Jung, Seongnam-si (KR); Dongwon Kim, Seongnam-si (KR); Myung Gil Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 55 days.

(21) Appl. No.: 17/192,959

(22) Filed: Mar. 5, 2021

(65) Prior Publication Data

US 2022/0020859 A1 Jan. 20, 2022

(30) Foreign Application Priority Data

Jul. 17, 2020 (KR) .......................... 10-2020-0089055

(51) Int. Cl.
*H01L 29/423* (2006.01)
*H01L 27/092* (2006.01)
*H01L 23/528* (2006.01)
*H01L 29/417* (2006.01)

(52) U.S. Cl.
CPC .... *H01L 29/42356* (2013.01); *H01L 23/5286* (2013.01); *H01L 27/092* (2013.01); *H01L 29/41775* (2013.01); *H01L 29/42376* (2013.01)

(58) Field of Classification Search
CPC ......... H01L 29/41775; H01L 29/42356; H01L 29/42376; H01L 27/092; H01L 23/5286
USPC ............................................................ 257/288
See application file for complete search history.

(56) References Cited

U.S. PATENT DOCUMENTS

| | | | |
|---|---|---|---|
| 6,495,454 | B2 | 12/2002 | Livengood et al. |
| 6,521,935 | B2* | 2/2003 | Krautschneider ........................... H01L 29/78642 438/242 |
| 9,026,975 | B2 | 5/2015 | Song et al. |
| 9,530,796 | B2 | 12/2016 | Stuber et al. |
| 2017/0148682 | A1 | 5/2017 | Basker et al. |
| 2019/0155984 | A1 | 5/2019 | Chen et al. |
| 2019/0198491 | A1 | 6/2019 | Do et al. |

(Continued)

FOREIGN PATENT DOCUMENTS

KR 1020190058369 A 5/2019

*Primary Examiner* — Monica D Harrison
(74) *Attorney, Agent, or Firm* — Myers Bigel, P.A.

(57) ABSTRACT

Semiconductor devices and methods of forming the same are disclosed. The semiconductor devices may include a substrate including a first region and a second region, which are spaced apart from each other with a device isolation layer interposed therebetween, a first gate electrode and a second gate electrode on the first and second regions, respectively, an insulating separation pattern separating the first gate electrode and the second gate electrode from each other and extending in a second direction that traverses the first direction, a connection structure electrically connecting the first gate electrode to the second gate electrode, and a first signal line electrically connected to the connection structure. The first and second gate electrodes are extended in a first direction and are aligned to each other in the first direction. The first signal line may extend in the second direction and may vertically overlap the insulating separation pattern.

20 Claims, 27 Drawing Sheets

(56) References Cited

U.S. PATENT DOCUMENTS

2019/0198627 A1 6/2019 Then et al.
2020/0066712 A1 2/2020 Hafez et al.

* cited by examiner

SEMICONDUCTOR DEVICES

CROSS-REFERENCE TO RELATED APPLICATION

This U.S. non-provisional patent application claims priority under 35 U.S.C. § 119 to Korean Patent Application No. 10-2020-0089055, filed on Jul. 17, 2020, in the Korean Intellectual Property Office, the entire contents of which are hereby incorporated by reference.

BACKGROUND

The present disclosure generally relates to a semiconductor device, and in particular, to a semiconductor device including a field effect transistor and a method of fabricating the same.

Due to their small size, multifunctional capability, and/or low manufacturing cost, semiconductor devices may be as important elements in the electronics industry. The semiconductor devices are classified into a semiconductor memory device for storing data, a semiconductor logic device for processing data, and a hybrid semiconductor device including both memory and logic elements. As the electronics industry advances, there is an increasing demand for semiconductor devices with improved characteristics. For example, there is an increasing demand for semiconductor devices with high reliability, high performance, and/or multiple functions. To meet this demand, complexity and/or integration density of semiconductor devices are being increased.

SUMMARY

Example embodiments of the inventive concept provide semiconductor devices with an increased integration density and improved reliability.

According to some embodiments of the inventive concept, semiconductor devices may include a substrate including a first region and a second region, which are spaced apart from each other with a device isolation layer interposed therebetween, a first gate electrode and a second gate electrode, which are respectively on the first region and the second region, extend in a first direction, and are aligned with each other in the first direction, an insulating separation pattern separating the first gate electrode and the second gate electrode from each other and extending in a second direction that traverses the first direction, a connection structure electrically connecting the first gate electrode to the second gate electrode, and a first signal line electrically connected to the connection structure. The first signal line may extend in the second direction and may vertically overlap the insulating separation pattern.

According to some embodiments of the inventive concept, semiconductor devices may include a substrate including a first region and a second region, which are spaced apart from each other with a device isolation layer interposed therebetween, the first region including first active patterns, and the second region including second active patterns. The devices may also include a first gate electrode and a second gate electrode, which are respectively on the first region and the second region, extend in a first direction, and are aligned with each other in the first direction, an insulating separation pattern separating the first gate electrode and the second gate electrode from each other and extending in a second direction that traverses the first direction, a connection structure electrically connecting the first gate electrode to the second gate electrode, and a first signal line electrically connected to the connection structure. The substrate may include first trenches between the first active patterns and between the second active patterns and a second trench between the first region and the second region. A bottom surface of the insulating separation pattern may be at a level lower than a bottom surface of the second trench relative to the substrate.

According to some embodiments of the inventive concept, semiconductor devices may include a substrate including a first region and a second region, which are spaced apart from each other with a device isolation layer interposed therebetween, a first gate electrode and a second gate electrode, which are respectively on the first region and the second region, extend in a first direction, and are aligned with each other in the first direction, the first gate electrode including a first side and a second side that are opposing each other, and the second gate electrode including a first side and a second side that are opposing each other. The devices may also include an insulating separation pattern separating the first gate electrode and the second gate electrode from each other and extending in a second direction that traverses the first direction, a connection structure electrically connecting the first gate electrode to the second gate electrode, a first signal line electrically connected to the connection structure, a first source/drain region adjacent the first side of the first gate electrode, a second source/drain region adjacent the first side of the second gate electrode, a first active contact and a second active contact on the first source/drain region and the second source/drain region, respectively, a second signal line electrically connecting the first and second source/drain regions to each other, through the first and second active contacts, a third source/drain region adjacent the second side of the first gate electrode, a fourth source/drain region adjacent the second side of the second gate electrode, a first power rail electrically connected to the third source/drain region and extending in the second direction, and a second power rail electrically connected to the fourth source/drain region and extended in the second direction. The first signal line may extend in the second direction and may vertically overlap the insulating separation pattern.

According to some embodiments of the inventive concept, semiconductor devices may include a unit cell including a first active region and a second active region spaced apart from each other in a cell height direction and a first gate electrode and a second gate electrode vertically overlapping the first active region and second active region, respectively. The first gate electrode and the second gate electrode may be spaced apart from each other in the cell height direction and may be colinear along the cell height direction. The devices may also include a connection structure that electrically connects the first gate electrode and the second gate electrode and vertically overlaps a portion of the first gate electrode and a portion of the second gate electrode and a signal line electrically connected to the connection structure. The signal line may extend in a cell width direction and may be between the first gate electrode and the second gate electrode in a plan view.

BRIEF DESCRIPTION OF THE DRAWINGS

Example embodiments will be more clearly understood from the following description taken in conjunction with the accompanying drawings. The accompanying drawings represent non-limiting, example embodiments as described herein.

FIGS. 12A to 14A, 12B to 14B, and 12C to 14C are cross-sectional views illustrating a method of fabricating a semiconductor device, according to some embodiments of the inventive concept, taken along the lines I-I', II-II', and III-III' of FIG. 1.

DETAILED DESCRIPTION

Example embodiments of the inventive concepts will now be described more fully with reference to the accompanying drawings, in which example embodiments are shown.

Figure 1:
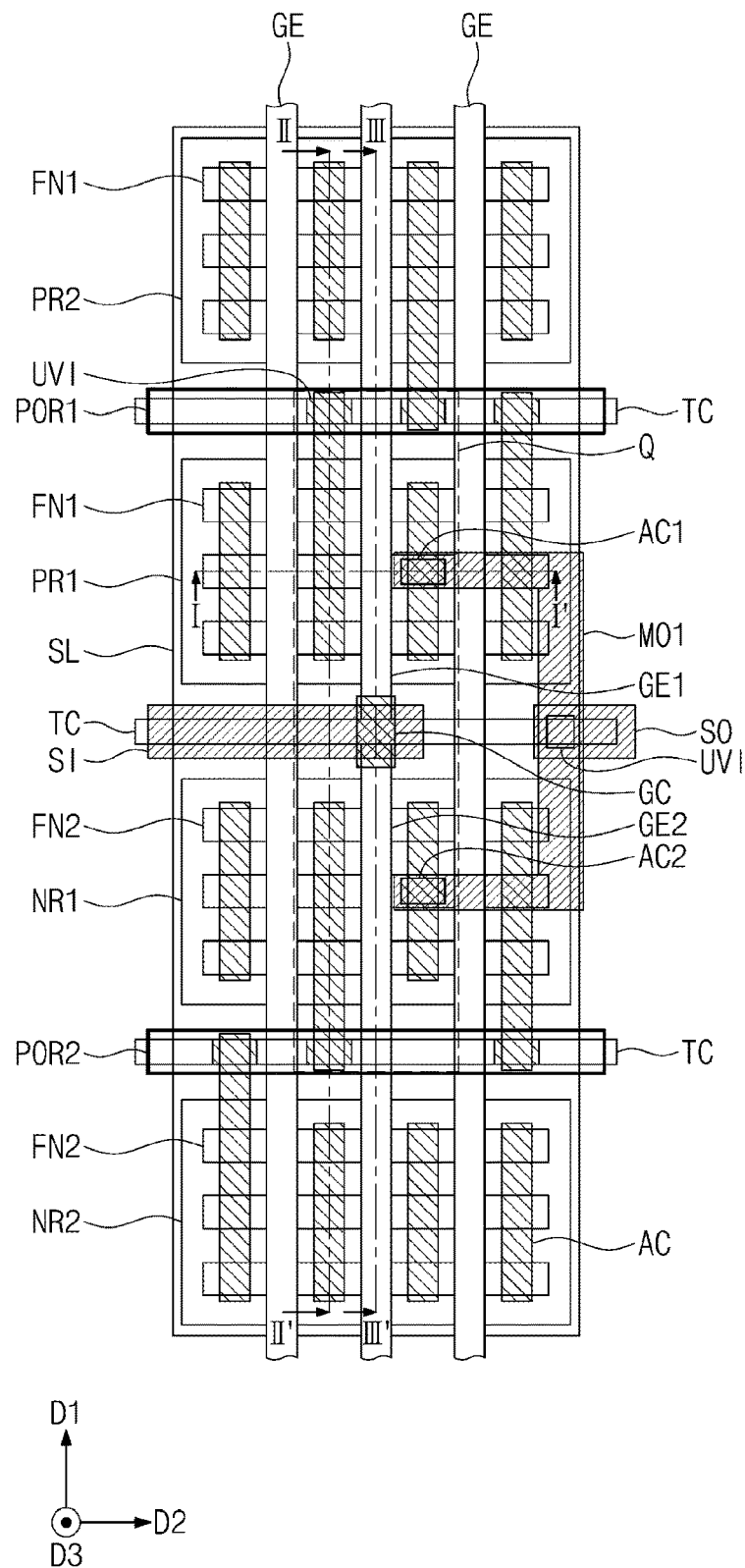
FIG. 1 is a plan view illustrating a semiconductor device according to some embodiments of the inventive concept.
Figure 2:
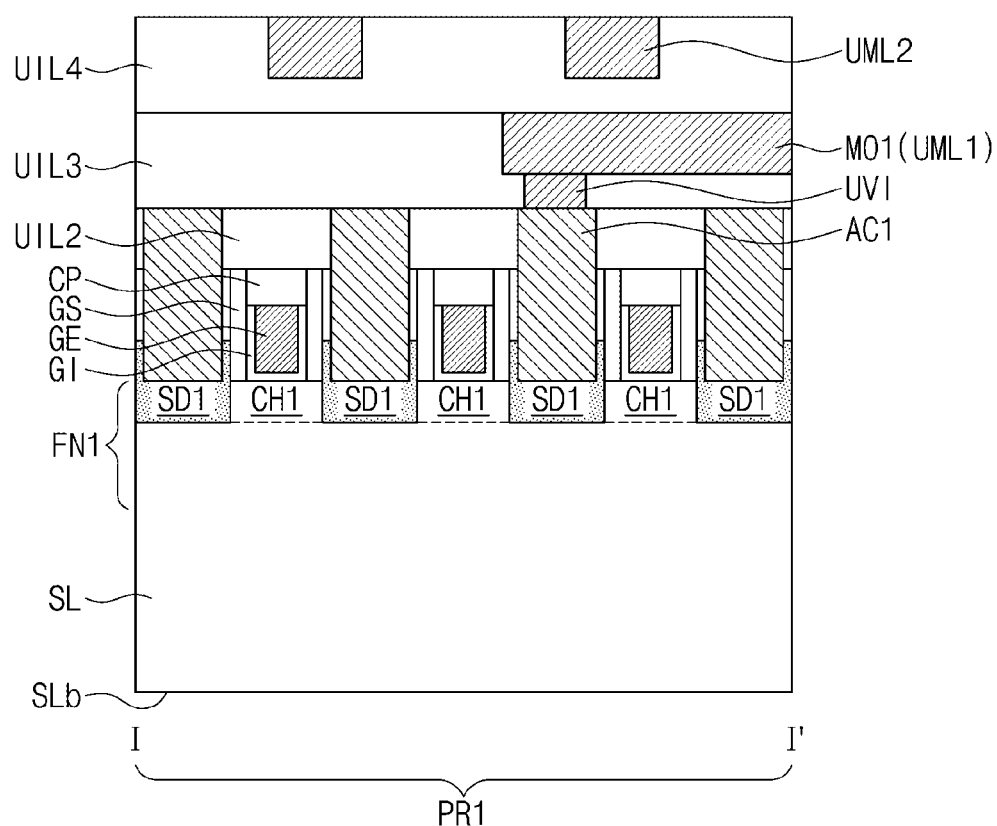
FIGS. 2 to 4 are cross-sectional views, which are respectively taken along lines I-I', II-II' and III-III' of FIG. 1.
Figure 3:
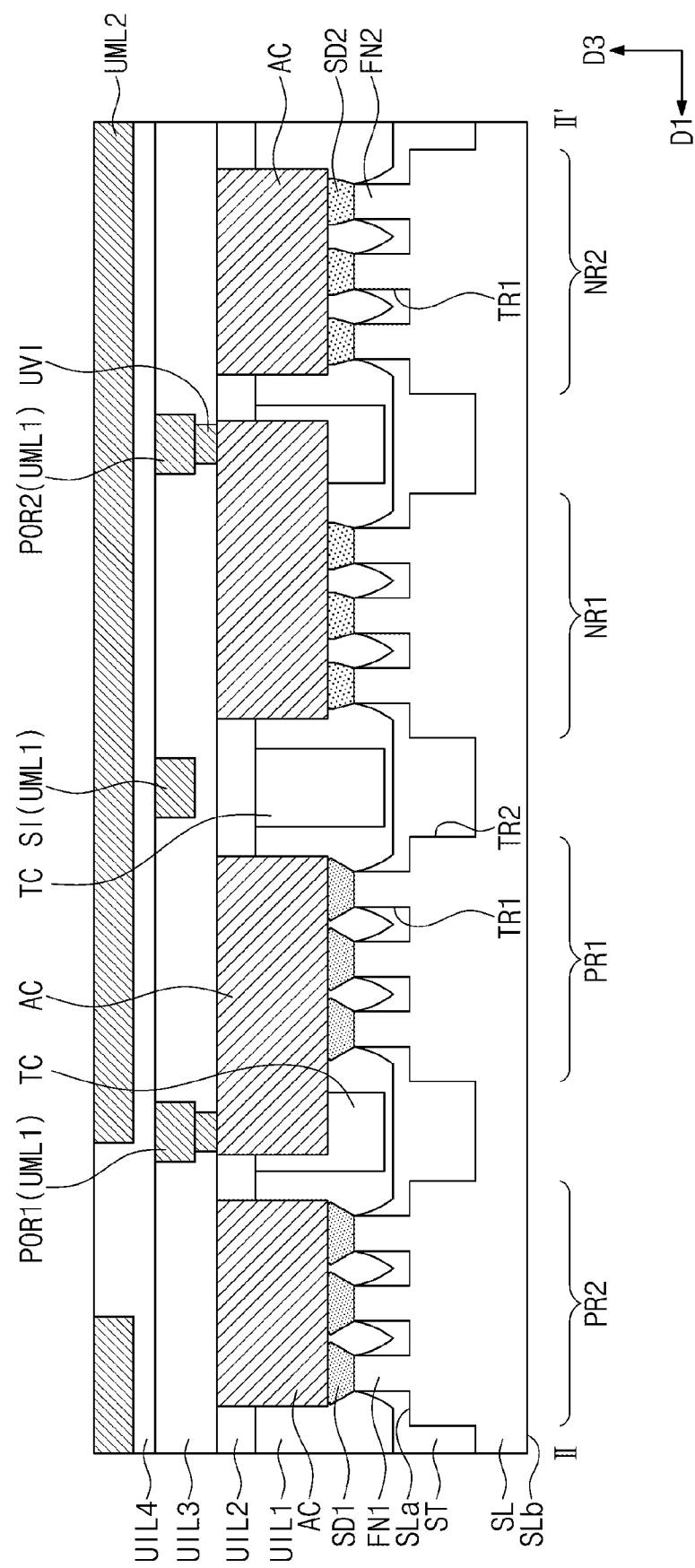
Figure 4:
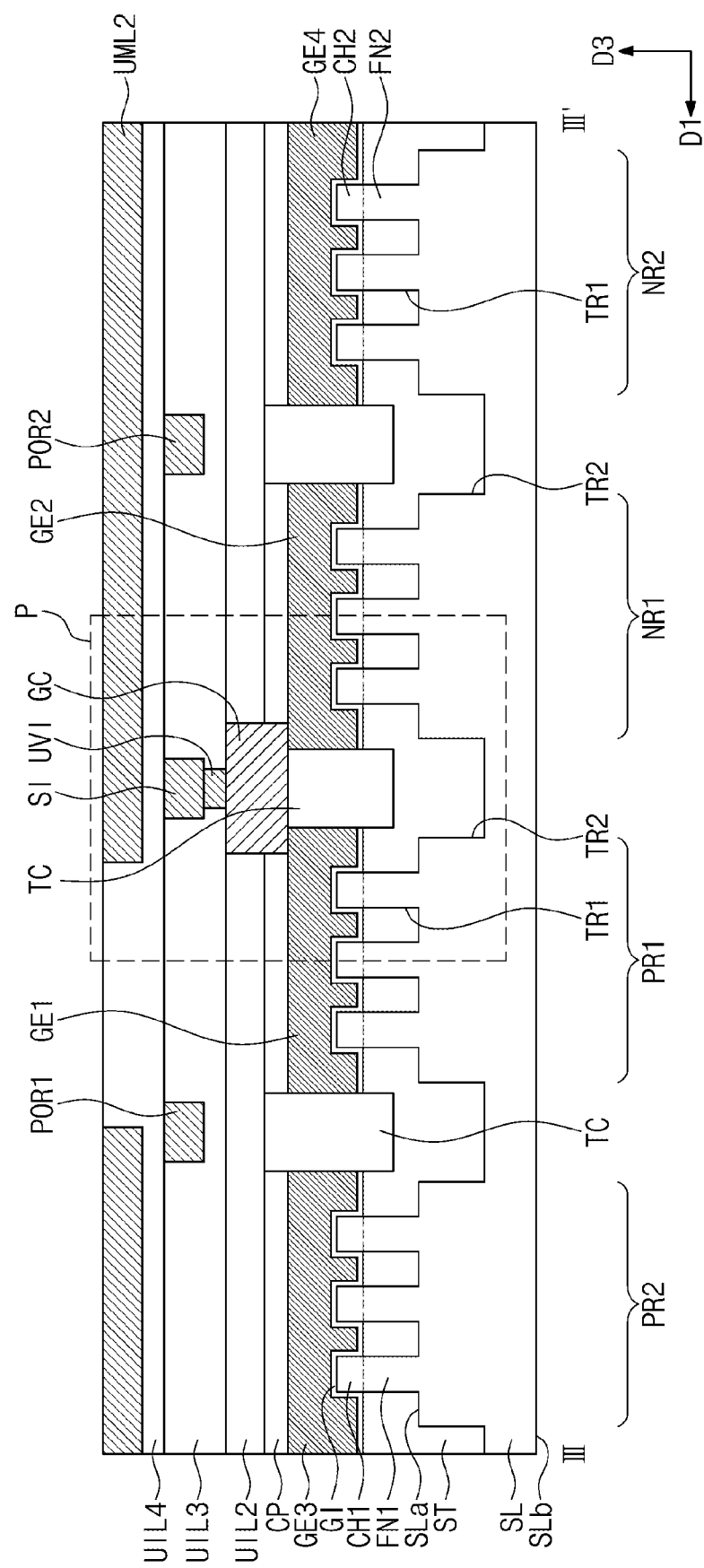
Figure 5:
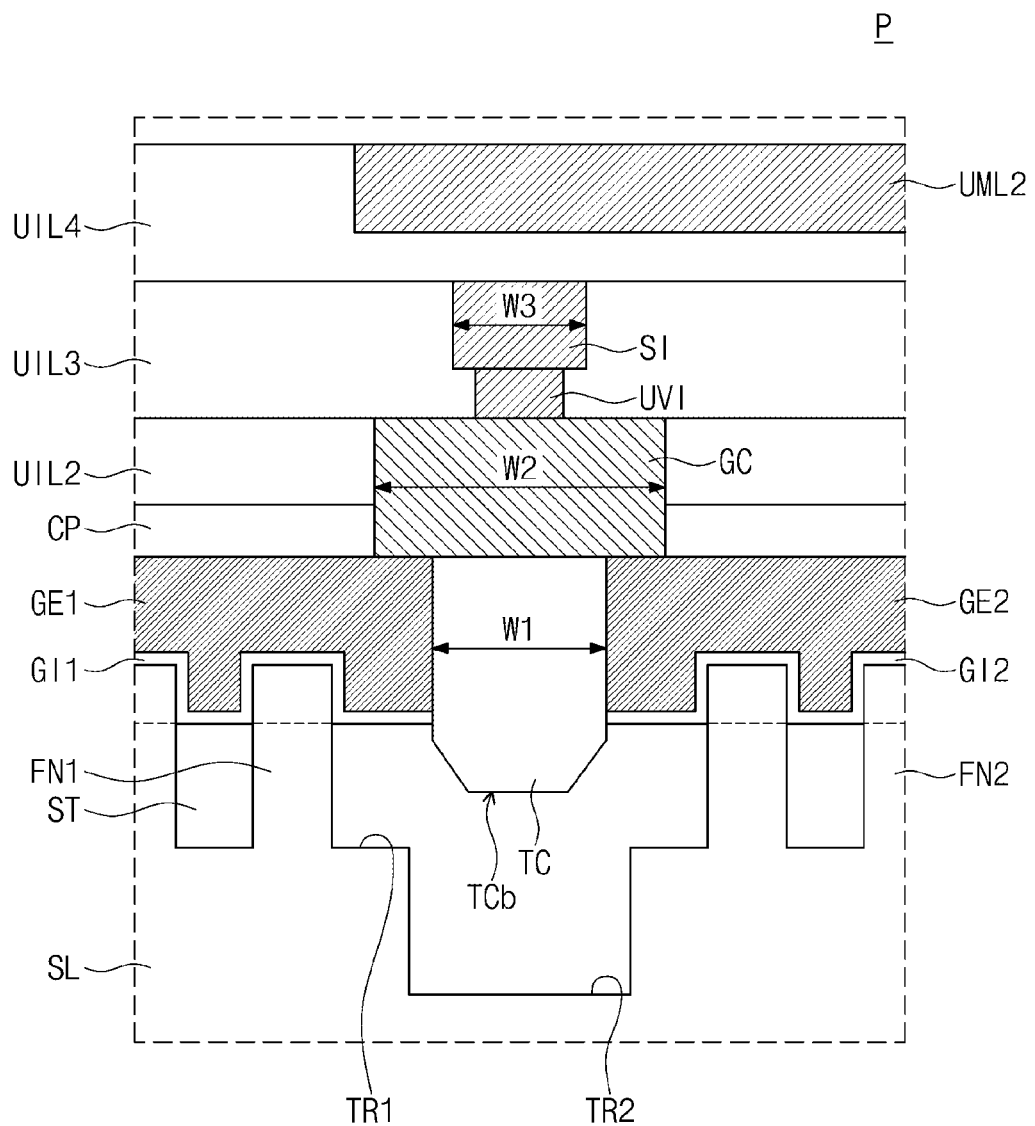
FIG. 5 is an enlarged view of a region P of FIG. 4.

FIG. 1 is a plan view illustrating a semiconductor device according to some embodiments of the inventive concept. FIGS. 2 to 4 are cross-sectional views, which are respectively taken along lines I-I', II-II', and III-III' of FIG. 1. FIG. 5 is an enlarged view of a region P of FIG. 4.

Referring to FIGS. 1 to 5, a substrate SL may be provided. The substrate SL may include first active regions PR1 and PR2 and second active regions NR1 and NR2. As an example, the substrate SL may be a semiconductor substrate, which is formed of or includes a semiconductor material (e.g., silicon or germanium). The substrate SL may have a first surface SLa and a second surface SLb, which is opposite the first surface SLa.

A device isolation layer ST may be provided on the first surface SLa of the substrate SL. The device isolation layer ST may define the first active regions PR1 and PR2 and the second active regions NR1 and NR2. As an example, the first active regions PR1 and PR2 may be PMOSFET regions, and the second active regions NR1 and NR2 may be NMOSFET regions. Each of the first and second active regions PR1, PR2, NR1, and NR2 may be defined by a second trench TR2, which is formed in the first surface SLa of the substrate SL and is filled with the device isolation layer ST. As an example, the device isolation layer ST may include a silicon oxide layer.

The first active regions PR1 and PR2 and the second active regions NR1 and NR2 may be arranged in a first direction D1. As an example, the first active regions PR1 and PR2 and the second active regions NR1 and NR2 may be spaced apart from each other in the first direction D1, with the device isolation layer ST interposed therebetween. The first active regions PR1 and PR2 may include a first region PR1 and a third region PR2. The second active regions NR1 and NR2 may include a second region NR1 and a fourth region NR2. The first region PR1 and the second region NR1 may be adjacent to each other, and the third region PR2 may be spaced apart from the second region NR1 with the first region PR1 interposed therebetween. The fourth region NR2 may be spaced apart from the first region PR1 with the second region NR1 interposed therebetween. The first direction D1 may be parallel to the second surface SLb of the substrate SL and may be referred to as a first horizontal direction.

A plurality of first active patterns FN1 extending in a second direction D2 may be provided on each of the first active regions PR1 and PR2. A plurality of second active patterns FN2 extending in the second direction D2 may be provided on each of the second active regions NR1 and NR2. The first and second active patterns FN1 and FN2 may be vertically-protruding portions of the substrate SL. The first and second active patterns FN1 and FN2 may protrude vertically from the first surface SLa. The first and second active patterns FN1 and FN2 may be arranged in the first direction D1. As used herein, "an element A extends in a direction X" (or similar language) may mean that the element A extends longitudinally in the direction X. The second direction D2 may be parallel to the second surface SLb of the substrate SL and may be referred to as a second horizontal direction. The second direction D2 may be different from the first direction D1 and may traverse the first direction D1. In some embodiments, the first direction D1 may be perpendicular to the second direction D2.

As an example, three first active patterns FN1 may be provided on the first region PR1 and may be extended in the second direction D2 to be parallel to each other. As an example, three second active patterns FN2 may be provided on the second region NR1 and may be extended in the second direction D2 to be parallel to each other. However, the inventive concept is not limited to the numbers and shapes of the first and second active patterns FN1 and FN2 on the first and second regions PR1 and NR1 illustrated in the drawings.

A first trench TR1 may be defined between a pair of the active patterns FN1 and FN2 that are adjacent to each other in the first direction D1. A bottom surface of the first trench TR1 is illustrated to be located at a level higher than a bottom surface of the second trench TR2, but in some embodiments, the bottom surface of the first trench TR1 may be located at a level that is equal to or lower than that of the bottom surface of the second trench TR2. The device isolation layer ST may fill the first trench TR1. A material filling the first trench TR1 may be equal to a material filling the second trench TR2, but the inventive concept is not limited to this example and the first and second trenches TR1 and TR2 may be filled with different materials. As used herein, "a surface A is higher than a surface B" (or similar language) may mean that a distance between the surface A and the second surface SLb is greater than the surface B and the second surface SLb.

Upper portions of the first and second active patterns FN1 and FN2 may be located at a level higher than a top surface of the device isolation layer ST. The upper portions of the first and second active patterns FN1 and FN2 may protrude vertically relative to the device isolation layer ST. An upper portion of each of the first and second active patterns FN1 and FN2 may have a fin shape protruding from the device isolation layer ST.

An upper portion of each of the first active patterns FN1 may include first channel regions CH1 and first source/drain regions SD1. The first source/drain regions SD1 may be p-type impurity regions. Each of the first channel regions CH1 may be interposed between a pair of the first source/drain regions SD1. An upper portion of each of the second active patterns FN2 may include second channel regions CH2 and second source/drain regions SD2. The second source/drain regions SD2 may be n-type impurity regions. Each of the second channel regions CH2 may be interposed between a pair of the second source/drain regions SD2.

The first and second source/drain regions SD1 and SD2 may be epitaxial patterns, which are formed by a selective epitaxial growth process. Top surfaces of the first and second source/drain regions SD1 and SD2 may be higher than top surfaces of the first and second channel regions CH1 and CH2.

As an example, the first source/drain regions SD1 may be formed of or include a semiconductor material whose lattice constant is larger than that of the semiconductor material of the substrate SL. In this case, the first source/drain regions SD1 may exert a compressive stress on the first channel regions CH1. As an example, the second source/drain regions SD2 may be formed of or include the same semiconductor material as the substrate SL. For example, the first source/drain regions SD1 may be formed of or include silicon-germanium, and the second source/drain regions SD2 may be formed of or include silicon. As shown in FIG. 3, a cross-sectional shape of each of the first source/drain regions SD1 may be different from that of the second source/drain regions SD2, when viewed in a sectional view in the first direction D1.

Gate electrodes GE may be provided to cross the first and second active patterns FN1 and FN2 and may be extended in the first direction D1. The gate electrodes GE may be spaced apart from each other in the second direction D2. The gate electrodes GE may vertically overlap the first and second channel regions CH1 and CH2. As shown in FIG. 4, each of the gate electrodes GE may be provided on a top surface and both side surfaces of each of the first and second channel regions CH1 and CH2. As an example, the gate electrodes GE may be formed of or include at least one of conductive metal nitrides (e.g., titanium nitride or tantalum nitride) or metals (e.g., titanium, tantalum, tungsten, copper, or aluminum). The material of the gate electrodes GE will be described in more detail below. As used herein, "an element A vertically overlaps an element B" (or similar language) means that at least one vertical line can be drawn that intersects both elements A and B.

A pair of gate spacers GS may be disposed on both side surfaces of each of the gate electrodes GE. The gate spacers GS may be extended along the gate electrodes GE and in the first direction D1. Top surfaces of the gate spacers GS may be higher than top surfaces of the gate electrodes GE. The top surfaces of the gate spacers GS may be coplanar with a top surface of a gate capping layer CP, which will be described below. In some embodiments, the gate spacers GS may be formed of or include at least one of SiCN, SiCON, or SiN. As an example, the gate spacers GS may have a multi-layered structure including at least two of SiCN, SiCON, or SiN.

A gate dielectric layer GI may be interposed between each of the gate electrodes GE and the first and second channel regions CH1 and CH2. The gate dielectric layer GI may be extended along a bottom surface of the gate electrode GE. The gate dielectric layer GI may cover a top surface and both side surfaces of each of the first and second channel regions CH1 and CH2. The gate dielectric layer GI may be formed of or include at least one of high-k dielectric materials whose dielectric constants are higher than that of silicon oxide. For example, the high-k dielectric material may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate capping layer CP may be provided on each of the gate electrodes GE. The gate capping layer CP may be extended along the gate electrode GE or in the first direction D1. The gate capping layer CP may be formed of or include a material, which is chosen to have an etch selectivity with respect to upper insulating layers to be described below. In detail, the gate capping layer CP may be formed of or include at least one of SiON, SiCN, SiCON, or SiN.

A first upper insulating layer UIL1, a second upper insulating layer UIL2, a third upper insulating layer UIL3, and a fourth upper insulating layer UIL4 may be sequentially stacked on the first surface SLa of the substrate SL. Each of the first to fourth upper insulating layers UIL1-UIL4 may include a silicon oxide layer or a silicon oxynitride layer. The first upper insulating layer UIL1 may cover the first and second active patterns FN1 and FN2.

Active contacts AC, which penetrate the first and second upper insulating layers UIL1 and UIL2 and are electrically connected to the first and second source/drain regions SD1 and SD2, may be provided between a pair of the gate electrodes GE. Each of the active contacts AC may be a bar-shaped structure extending in the first direction D1. As an example, each of the active contacts AC may be connected to a plurality of the first source/drain regions SD1 or a plurality of the second source/drain regions SD2.

A gate contact GC, which penetrates the second upper insulating layer UIL2 and the gate capping layer CP and is electrically connected to the gate electrode GE, may be provided on at least one of the gate electrodes GE. When viewed in a plan view, the gate contact GC may be disposed between the first region PR1 and the second region NR1. The gate contact GC may vertically overlap the device isolation layer ST filling the second trench TR2 between the first region PR1 and the second region NR1.

The active and gate contact AC and GC may be formed of or include the same conductive material. The active and gate contact AC and GC may be formed of or include at least one of metallic materials (e.g., aluminum, copper, tungsten, molybdenum, or cobalt).

First upper interconnection lines UML1 may be provided in the third upper insulating layer UIL3, and second upper interconnection lines UML2 may be provided in the fourth upper insulating layer UIL4. An upper via UVI may be provided below each of the first and second upper interconnection lines UML1 and UML2.

As an example, the first upper interconnection lines UML1 and the upper vias UVI may constitute a first metal layer. The second upper interconnection lines UML2 and the upper vias UVI may constitute a second metal layer. Although not shown, a plurality of metal layers may be additionally stacked on the second metal layer.

When viewed in a plan view, a first power rail POR1 may be provided between an adjacent pair of the first active regions PR1 and PR2. A second power rail POR2 may be provided between an adjacent pair of the second active regions NR1 and NR2. One of the first power rail POR1 and the second power rail POR2 may be a line, to which a power voltage VDD is applied, and the other may be a line, to which a ground voltage VSS is applied. As an example, the first power rail POR1 may be applied with the power voltage VDD, and the second power rail POR2 may be applied with the ground voltage VSS.

As an example, the first and second power rails POR1 and POR2 may be parts of the first upper interconnection lines UML1. The first power rail POR1 may be electrically connected to the first source/drain regions SD1 through the upper via UVI and the active contact AC. The second power rail POR2 may be electrically connected to the second source/drain regions SD2 through the upper via UVI and the active contact AC. Alternatively, the first and second power rails POR1 and POR2 may be parts of the second upper interconnection lines UML2 or parts of interconnection lines provided on the second upper interconnection lines UML2.

The gate electrodes GE, the first and second source/drain regions SD1 and SD2, and the interconnection lines on the first active regions PR1 and PR2 and the second active regions NR1 and NR2 may constitute transistors, and such transistors may constitute parts of an electronic circuit. A region Q of FIG. 1 may be a unit cell providing a Boolean logic function or a storage function. The first direction D1 may be a cell height direction, and the second direction D2 may be a cell width direction. As an example, the region Q of FIG. 1 may constitute an inverter. Hereinafter, the inverter in the region Q will be described in more detail.

In the region Q, a first signal voltage Vin may be applied to the gate electrodes GE on the first region PR1 and the second region NR1 through a first signal line SI. As an example, the first signal line SI may be a part of the first upper interconnection lines UML1. The first signal line SI may be electrically connected to the gate electrodes GE through the upper via UVI and the gate contact GC.

In the region Q, a second signal voltage Vout may be applied to the first and second source/drain regions SD1 and SD2 on the first region PR1 and the second region NR1 through a second signal line SO. As an example, the second signal line SO may be a part of the second upper interconnection lines UML2.

The second signal line SO may be electrically connected to the first and second source/drain regions SD1 and SD2, which are disposed at or adjacent a first side of the gate electrode GE and are spaced apart from the gate electrode in a direction (e.g., in the second direction D2), through the active contacts AC and a first intermediate line MO1. As an example, the first source/drain region SD1 may be connected to the first intermediate line MO1 through a first active contact AC1, and the second source/drain region SD2 may be connected to the first intermediate line MO1 through a second active contact AC2.

The first intermediate line MO1 may be a part of the first upper interconnection lines UML1. The upper vias UVI may be respectively provided between the second signal line SO and the first intermediate line MO1 and between the active contacts AC1 and AC2 and the first and second source/drain regions SD1 and SD2.

The gate electrode GE may also include a second side that is opposite the first side and is spaced apart from the first side thereof in the second direction D2. The first source/drain region SD1, which is disposed at or adjacent the second side of the gate electrode GE, may be electrically connected to the first power rail POR1 through the active contact AC. The second source/drain region SD2, which is disposed at or adjacent the second side of the gate electrode GE, may be electrically connected to the second power rail POR2 through the active contact AC.

So far, the inverter in the region Q has been described as an example of the semiconductor device according to some embodiments of the inventive concept, but the inventive concept is not limited to this example (i.e., the inverter) and may be applied to other devices or standard cells in the same manner. Hereinafter, the gate electrode GE, the gate contact GC, and the first signal line SI will be described in more detail.

The gate electrode GE may include a first gate electrode GE1 on the first region PR1 and a second gate electrode GE2 on the second region NR1. The gate electrode GE may include a third gate electrode GE3 on the third region PR2 and a fourth gate electrode GE4 on the fourth region NR2. The first to fourth gate electrodes GE1 to GE4 may be aligned with each other in the first direction D1 and may be colinear along the first direction D1.

A first gate dielectric layer GI1 may be provided between the first gate electrode GE1 and the first active patterns FN1. A second gate dielectric layer GI2 may be provided between the second gate electrode GE2 and the second active patterns FN2.

The first and second gate electrodes GE1 and GE2 may be spaced apart from each other with an insulating separation pattern TC interposed therebetween. As an example, the insulating separation pattern TC may be a line-shape pattern extending in the second direction D2. Some of the gate electrodes GE may not be divided by the insulating separation pattern TC. For example, a plurality of bar-shaped insulating separation patterns TC, which are spaced apart from each other, may be disposed in the second direction D2, and each of the insulating separation pattern TC may divide at least one of the gate electrodes GE into two portions. The insulating separation pattern TC may be formed of or include at least one of silicon oxide, silicon nitride, or silicon oxynitride.

The insulating separation patterns TC may also be arranged in the first direction D1, in addition to a region between the first and second gate electrodes GE1 and GE2. As an example, the insulating separation patterns TC may be provided between the first gate electrode GE1 and the third gate electrode GE3 and/or between the second gate electrode GE2 and the fourth gate electrode GE4. In this case, the insulating separation pattern TC may be extended below and along the first power rail POR1 and/or the second power rail POR2, as shown in FIGS. 1 and 4. In some embodiments, the insulating separation patterns TC may not be provided between the first region PR1 and the third region PR2 or between the second region NR1 and the fourth region NR2. The description that follows will refer to the insulating separation pattern TC between the first and second gate electrodes GE1 and GE2.

A top surface of the insulating separation pattern TC may be located at substantially the same level as a top surface of the first upper insulating layer UIL1. The top surface of the insulating separation pattern TC may be coplanar with the top surface of the gate capping layer CP. A portion of the top surface of the insulating separation pattern TC may be recessed to be lower than the top surface of the gate capping layer CP, and the gate contact GC may be connected to the gate electrodes GE through the recessed portion of the insulating separation pattern TC.

The insulating separation pattern TC may be extended in a direction toward the substrate SL (e.g., opposite a third direction D3) to separate the first gate dielectric layer GI1 from the second gate dielectric layer GI2. A lower portion of the insulating separation pattern TC may be inserted in the device isolation layer ST. In some embodiments, as shown in FIG. 5, a bottom surface TCb of the insulating separation pattern TC may be lower than the bottom surfaces of the first and second gate dielectric layers GI1 and GI2 and may be higher than the bottom surface of the first trench TR1. The insulating separation pattern TC may be in contact with the side surface of the first gate electrode GE1 and the side surface of the second gate electrode GE2. The third direction D3 may be perpendicular to the second surface SLb of the substrate SL and may be referred to as a vertical direction.

Each of the first and second gate electrodes GE1 and GE2 may include at least one metal material, and the first and second gate electrodes GE1 and GE2 may have different work functions from each other. As an example, each of the first and second gate electrodes GE1 and GE2 may include a first metal layer, a second metal layer, and an upper conductive layer, which are sequentially stacked. Thicknesses of the first and/or second metal layers may be adjusted to allow the first and second gate electrodes GE1 and GE2 to have different work functions. As an example, the thickness of the first metal layer of the first gate electrode GE1 may be larger than the thickness of the first metal layer of the second gate electrode GE2. In some embodiments, the first metal layer may be formed of or include at least one of conductive metal nitrides (e.g., TiN, TaN, and WN). The second metal layer may be formed of or include at least one of aluminum compounds (e.g., TiAl, TiAlC, TaAl, and AlC). The upper conductive layer may be formed of or include at least one of materials having lower resistivity than the first and second metal layers. As an example, the upper conductive layer may be formed of or include tungsten (W). In some embodiments, one of the first and second gate electrodes GE1 and GE2 may further include a metal layer or a metal nitride layer, which is not included in the other. In some embodiments, the first and second gate electrodes GE1 and GE2 may include polysilicon layers doped with impurities of different conductivity types.

Due to their forming process, the first and second gate electrodes GE1 and GE2 may be formed together with each other and may be directly connected to each other. In this case, a parasitic capacitance between the first gate electrode GE1 and the first source/drain regions SD1 and between the second gate electrode GE2 and the second source/drain regions SD2 may be increased by a connection portion of the first and second gate electrodes GE1 and GE2 disposed on the device isolation layer ST. According to some embodiments of the inventive concept, since the first and second gate electrodes GE1 and GE2 are separated from each other by the insulating separation pattern TC, such a parasitic capacitance may be reduced. In addition, since each of the first and second gate electrodes GE1 and GE2 is shortened, it may be possible to reduce a cell height and an occupying area of the device. According to some embodiments of the inventive concept, since the first and second gate electrodes GE1 and GE2 are separated from each other by the insulating separation pattern TC, it may be possible to reduce or prevent diffusion of a gate material, which may occur when gates of different conductivity types are in direct contact with each other, and thereby to reduce or suppress a variation in threshold voltage of the device.

The first and second gate electrodes GE1 and GE2 may be electrically connected to each other through a connection structure. The connection structure may include a plurality of elements, such as the gate contact GC and the upper via UVI.

As an example, the first and second gate electrodes GE1 and GE2 may be connected to each other through the gate contact GC. A second width W2 of the gate contact GC in the first direction D1 may be larger than a first width W1 of the insulating separation pattern TC in the first direction D1. As an example, the second width W2 may be about 1.2 to 2 times the first width W1.

The first width W1 may correspond to a distance between the first and second gate electrodes GE1 and GE2 in the first direction D1. As an example, the second width W2 of the gate contact GC in the first direction D1 may be larger than its width in the second direction D2. The gate contact GC may be extended in the first direction D1 to be in common contact with the top surfaces of the second gate electrode GE2, the insulating separation pattern TC, and the first gate electrode GE1. The second width W2 of the gate contact GC may be greater than a third width W3 of the first signal line SI in the first direction D1. In other words, the gate contact GC may be a bar-shaped structure extending in a specific direction. In some embodiments, the first width W1 of the insulating separation pattern TC may be greater than the third width W3 of the first signal line SI. As an example, the first width W1 may be about 1.1 to 3 times the third width W3. In a plan view, the first signal line SI may be between the first and second gate electrodes GE1 and GE2 as illustrated in FIG. 1.

FIGS. 6 to 10 are enlarged views illustrating the region P of FIG. 4, according to some embodiments of the inventive concept. For concise description, previously described elements may be identified by the same reference numbers without repeating an overlapping description thereof. The inventive concept is not limited to the embodiments illustrated in FIGS. 5 through 10, and features of those embodiments can be combined.

Figure 6:
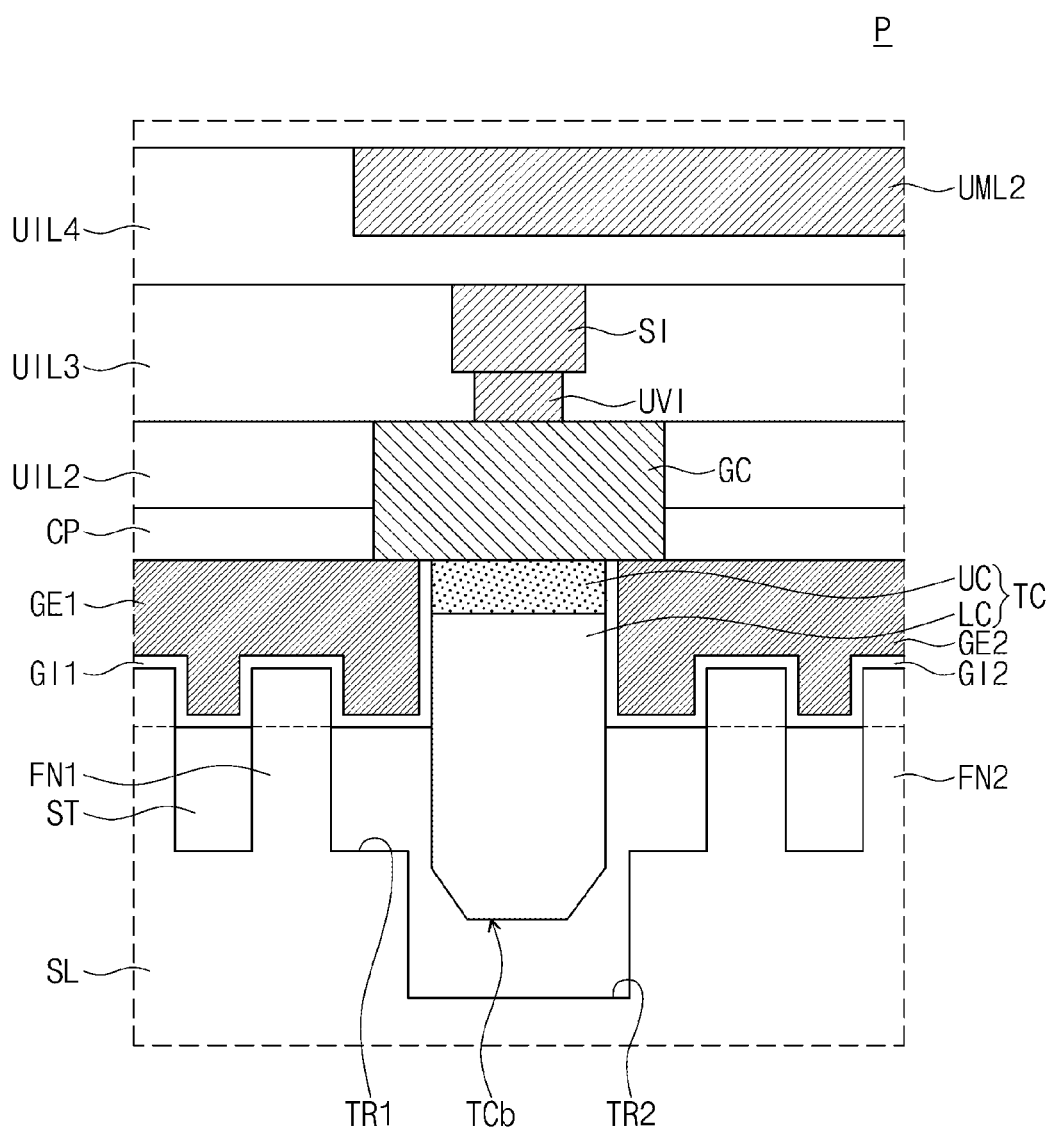
FIGS. 6 to 10 are enlarged views illustrating the region P of FIG. 4, according to some embodiments of the inventive concept.

Referring to FIG. 6, the insulating separation pattern TC may include a lower pattern LC and an upper pattern UC. The lower pattern LC may be connected to the device isolation layer ST. The upper pattern UC may be connected to the gate contact GC. The upper pattern UC and the lower pattern LC may be formed of or include different materials. The upper pattern UC may be formed of or include a material having a high etch resistant property with respect to a specific etchant, compared with the lower pattern LC. As an example, the upper pattern UC may be formed of or include at least one of SiN, SICN, SION, or SIOCN. The lower pattern LC may be formed of or include $SiO_2$. The upper pattern UC may be thinner than the lower pattern LC. The bottom surface TCb of the insulating separation pattern TC may be disposed between the bottom surface of the first trench TR1 and the bottom surface of the second trench TR2.

The insulating separation pattern TC may be spaced apart from the first gate electrode GE1 with the first gate dielectric layer GI1 interposed therebetween and may be spaced apart from the second gate electrode GE2 with the second gate dielectric layer GI2 interposed therebetween. In other words, the first gate dielectric layer GI1 may be extended into a region between the insulating separation pattern TC and the first gate electrode GE1, and the second gate dielectric layer GI2 may be extended into a region between the insulating separation pattern TC and the second gate electrode GE2.

Figure 7:
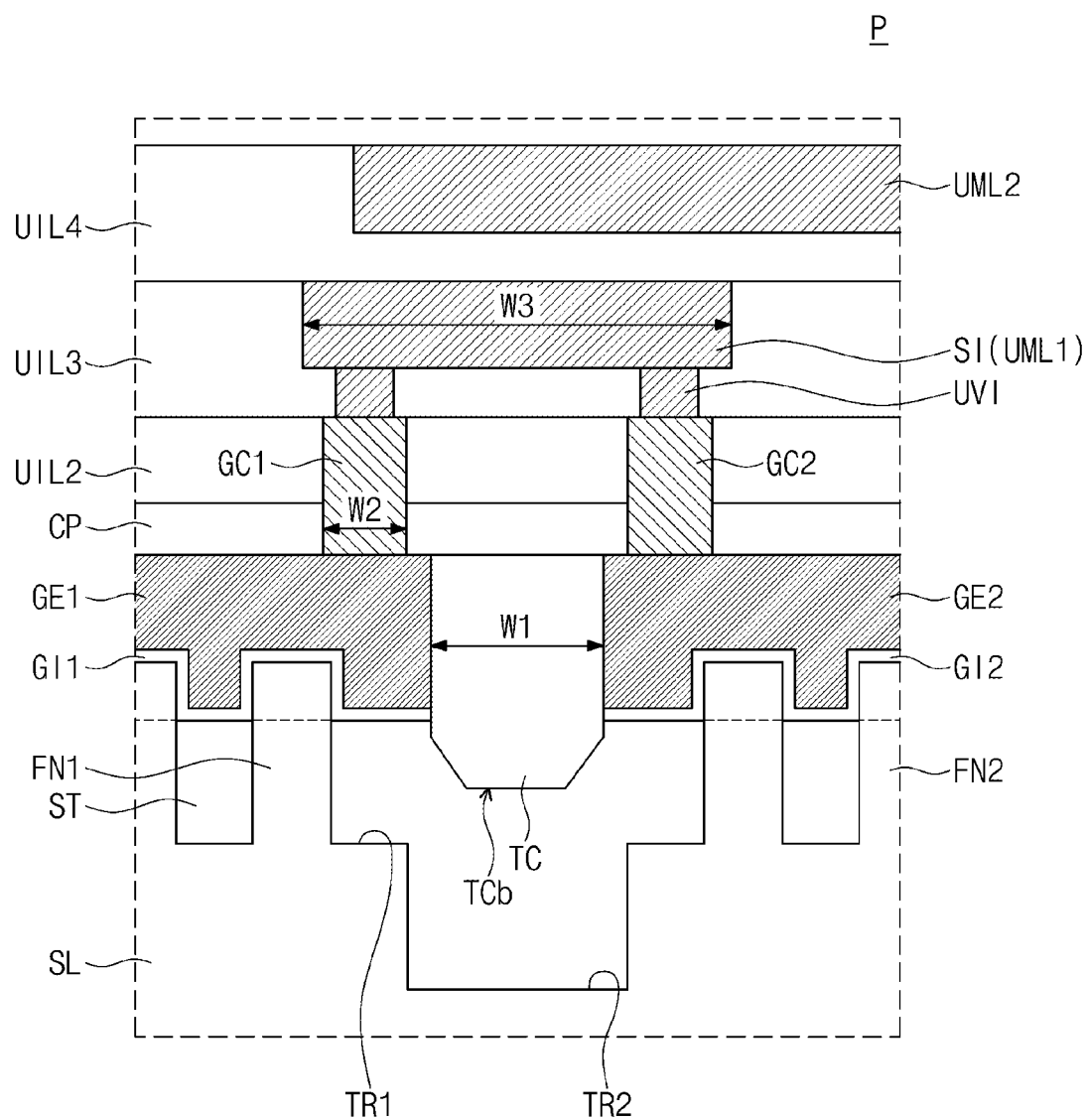
Figure 8:
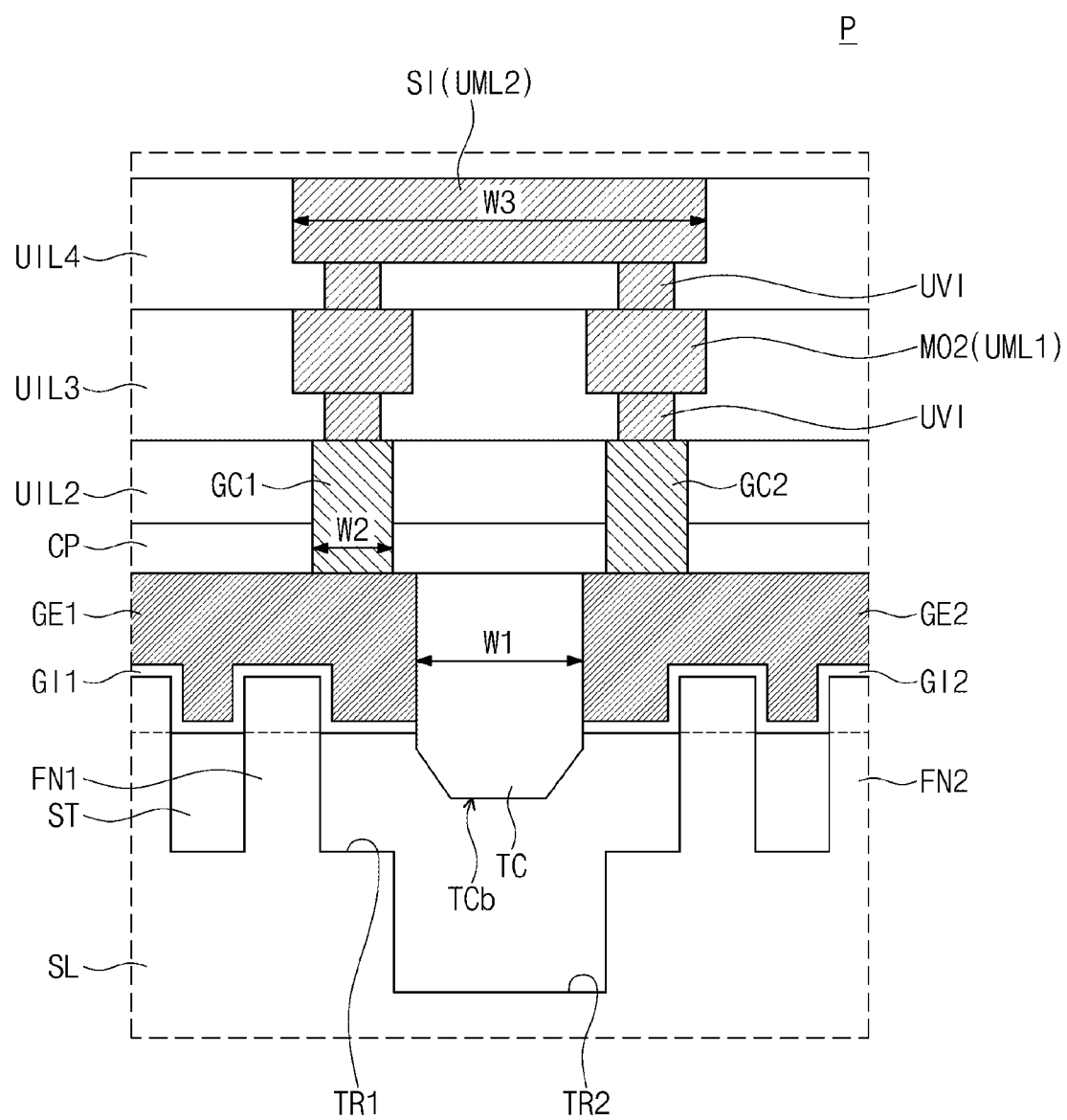

Referring to FIGS. 7 and 8, the first and second gate electrodes GE1 and GE2 may be connected to the first signal line SI through a first gate contact GC1 and a second gate contact GC2, respectively, which are separated from each other. As an example, the second width W2 of each of the first and second gate contacts GC1 and GC2 may be smaller than the third width W3 of the first signal line SI. In some embodiments, the third width W3 of the first signal line SI may be larger than the first width W1 of the insulating separation pattern TC. As an example, the third width W3 may be about 1.5 to 3 times the first width W1.

Referring to FIG. 7, the first signal line SI may be a part of the first upper interconnection lines UML1. Each of the first gate contact GC1 and the second gate contact GC2 may be connected to the first signal line SI through the upper via UVI. Referring to FIG. 8, the first signal line SI may be a part of the second upper interconnection lines UML2. In this case, each of the first gate contact GC1 and the second gate contact GC2 may be connected to the first signal line SI through the upper vias UVI and a first intermediate line MO2, which is a part of the first upper interconnection lines UML1.

Figure 9:
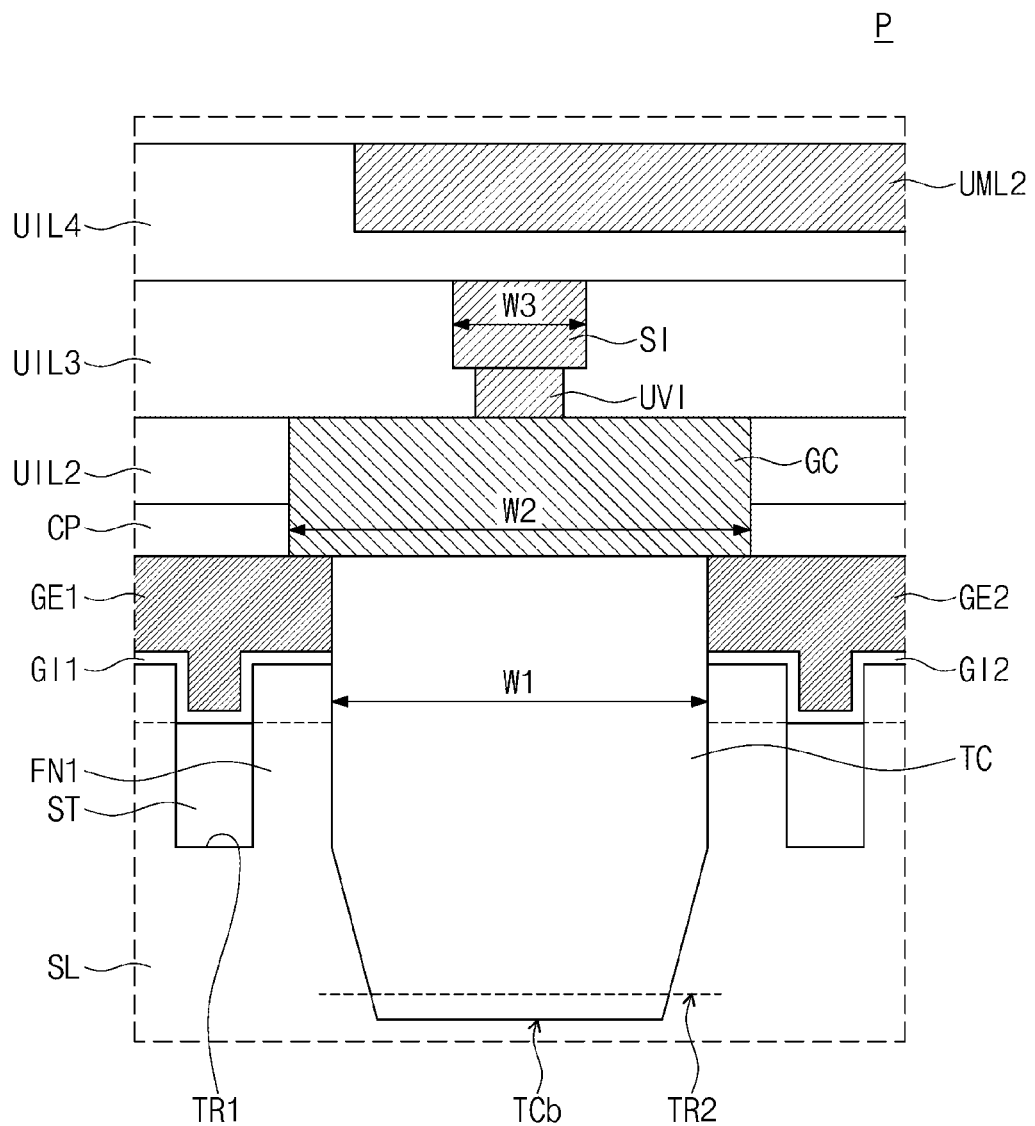

Referring to FIG. 9, the insulating separation pattern TC may pass through the device isolation layer ST and may be connected to the substrate SL. The bottom surface TCb of the insulating separation pattern TC may be located at a level lower than the bottom surface of the second trench TR2. A side surface of the insulating separation pattern TC may be in contact with the side surface of the first active pattern FN1 and/or the side surface of the second active pattern FN2. The second width W2 of the gate contact GC may be larger than the first width W1 of the insulating separation pattern TC, but the inventive concept is not limited to this example.

Figure 10:
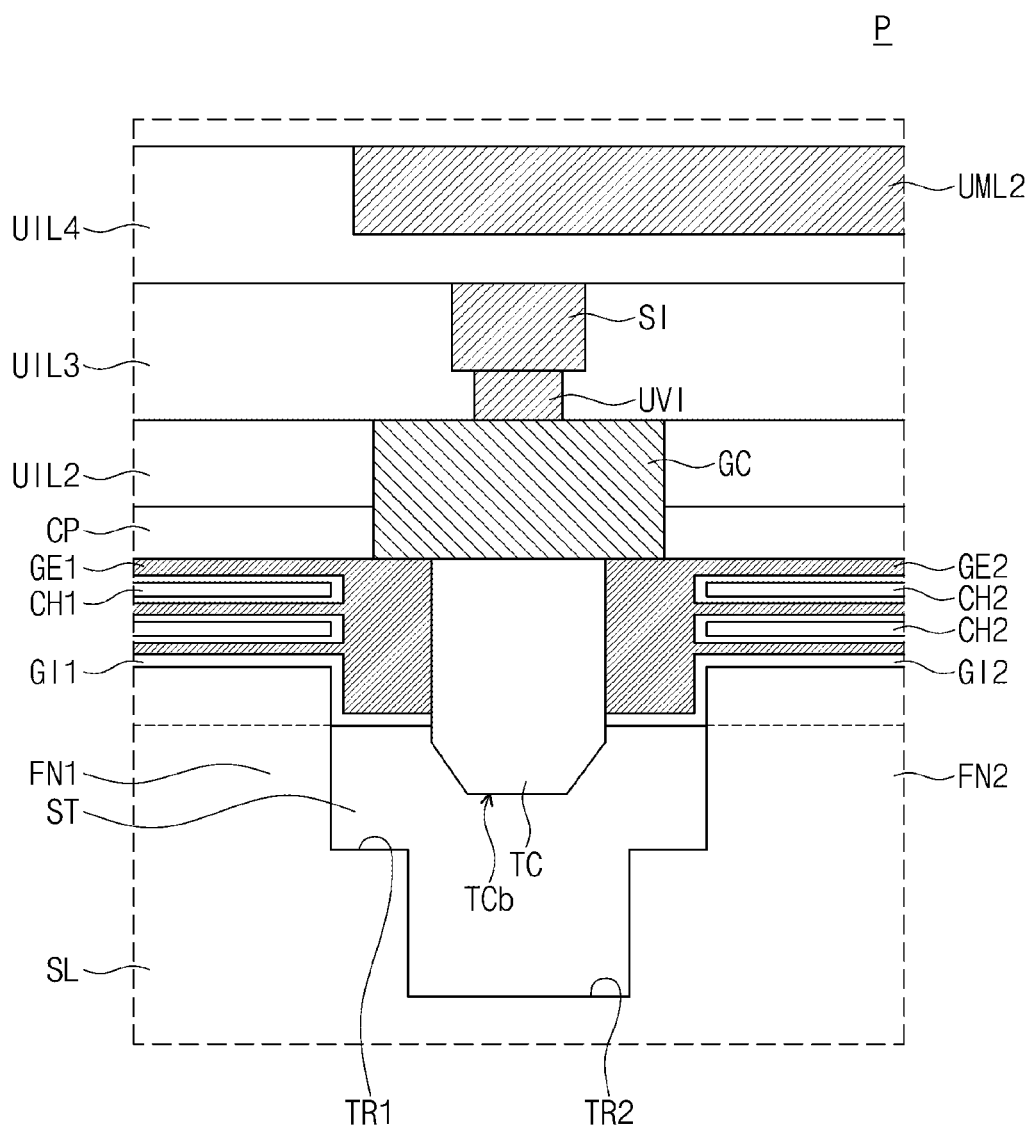

Referring to FIG. 10, the first active pattern FN1 may include the first channel regions CH1, which are vertically stacked. The first channel regions CH1 stacked may be spaced apart from each other in the third direction D3. The first channel regions CH1 may vertically overlap each other. The first gate dielectric layer GI1 may enclose each of the first channel regions CH1. The first gate electrode GE1 may be extended into a region between the first channel regions CH1.

The second active pattern FN2 may include the second channel regions CH2, which are vertically stacked. The second channel regions CH2 stacked may be spaced apart from each other in the third direction D3. The second channel regions CH2 may vertically overlap each other. The second gate dielectric layer GI2 may enclose each of the second channel regions CH2. The second gate electrode GE2 may be extended into a region between the second channel regions CH2.

Figure 11:
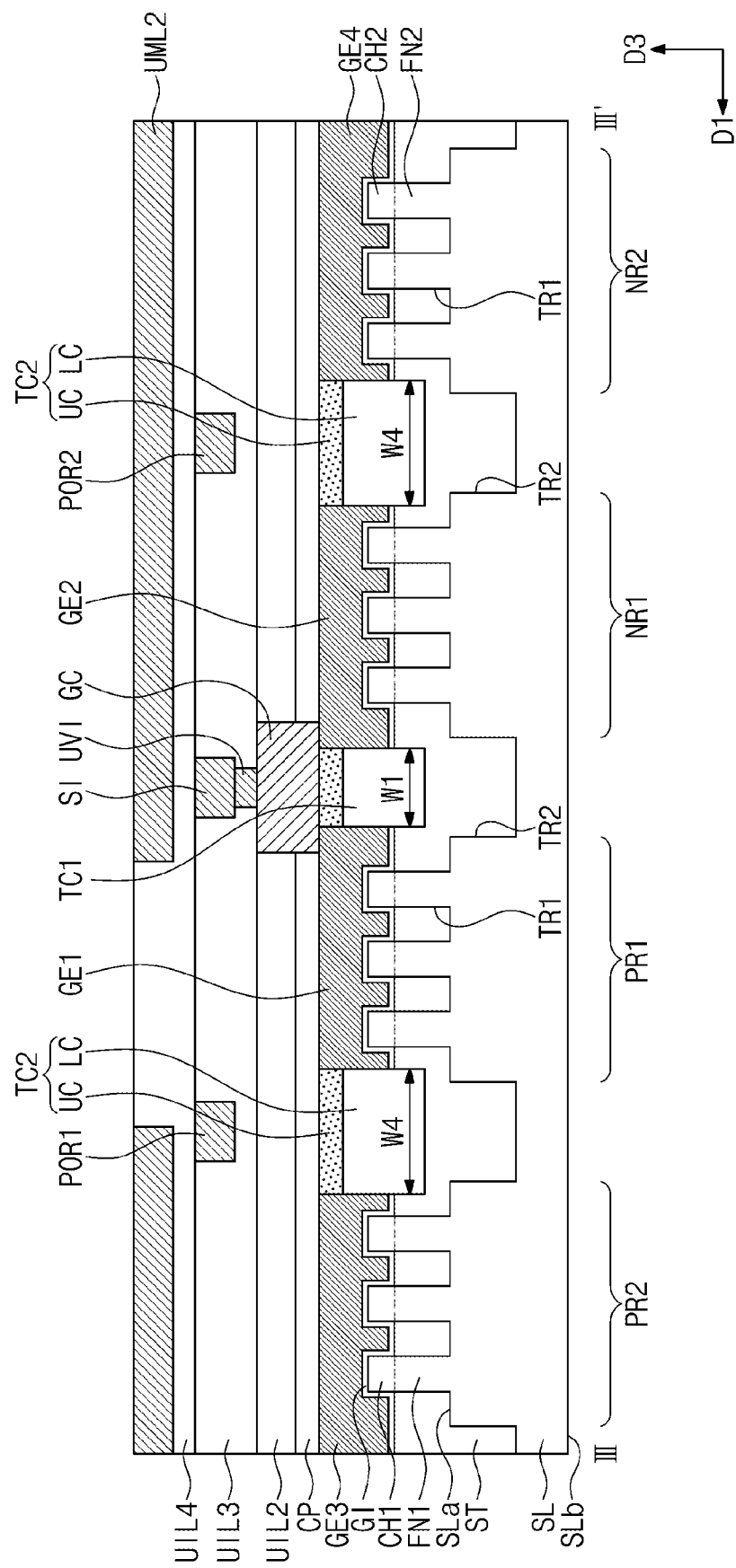
FIG. 11 is a cross-sectional view, which is taken along the line I-I' of FIG. 1 to illustrate a semiconductor device according to some embodiments of the inventive concept.

FIG. 11 is a cross-sectional view, which is taken along the line I-I' of FIG. 1 to illustrate a semiconductor device according to some embodiments of the inventive concept. For concise description, previously described elements may be identified by the same reference numbers without repeating an overlapping description thereof.

Referring to FIG. 11, a first insulating separation pattern TC1 may be provided between the first and second gate electrodes GE1 and GE2, and a second insulating separation pattern TC2 may be provided between the first gate electrode GE1 and the third gate electrode GE3. The second insulating separation pattern TC2 may also be provided between the second gate electrode GE2 and the fourth gate electrode GE4, but the inventive concept is not limited to this example. As an example, the second insulating separation patterns TC2 may be provided below the first power rail POR1 and the second power rail POR2, and the first insulating separation pattern TC1 may be provided below the first signal line SI.

Each of the first and second insulating separation patterns TC1 and TC2 may include the lower pattern LC and the upper pattern UC, but in some embodiments, it may have a single layered structure.

A fourth width W4 of the second insulating separation pattern TC2 may be larger than the first width W1 of the first insulating separation pattern TC1. As an example, the fourth width W4 may be about 1.2 to 2 times the first width W1.

FIGS. 12A to 14A, 12B to 14B, and 12C to 14C are cross-sectional views illustrating a method of fabricating a semiconductor device, according to some embodiments of the inventive concept, taken along the lines I-I', II-II', and III-III' of FIG. 1.

Figure 12A:
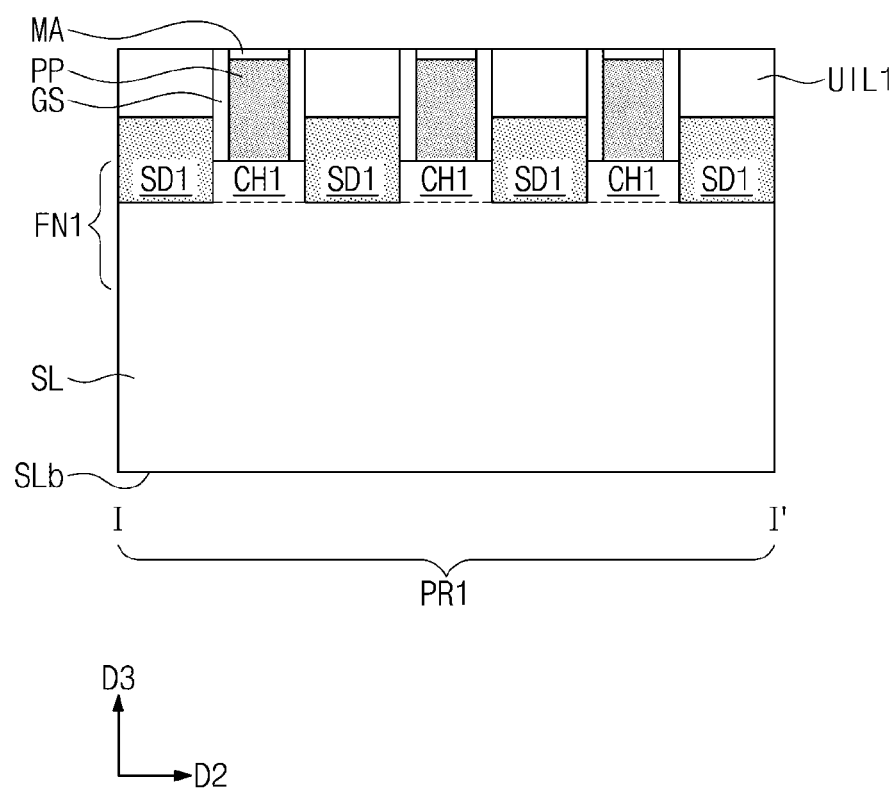
Figure 12B:
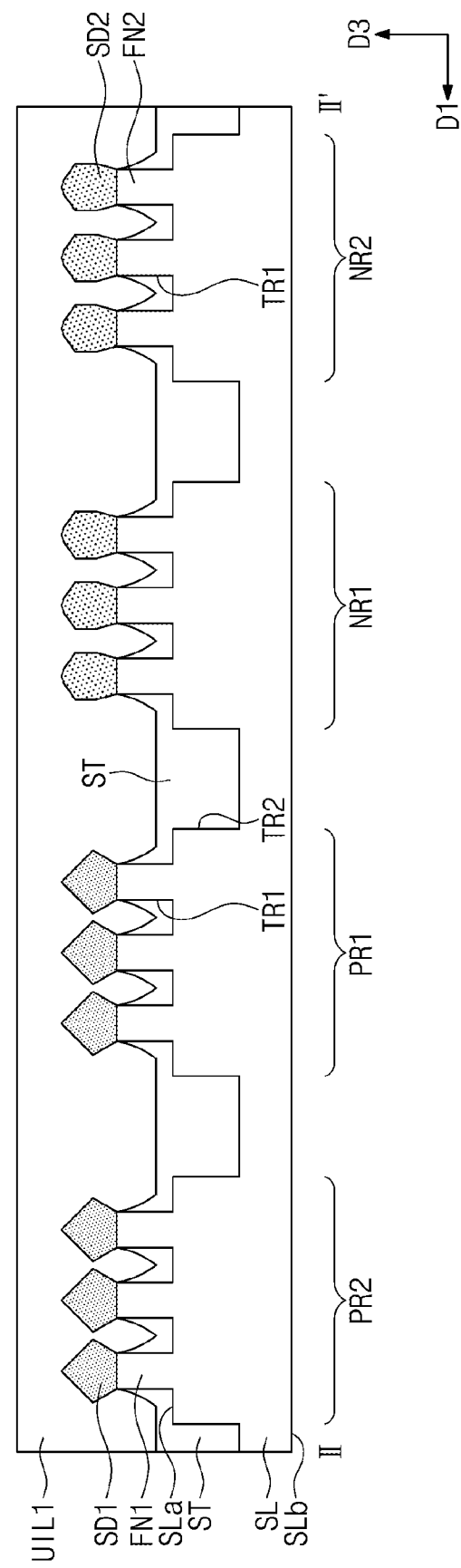
Figure 12C:
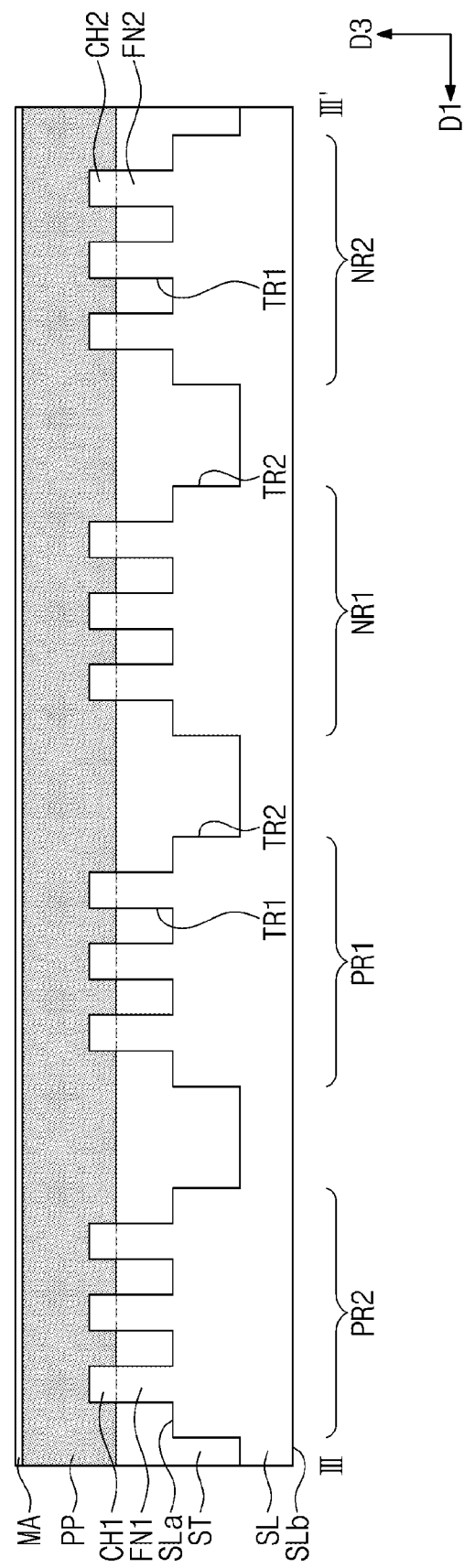

Referring to FIGS. 12A to 12C, an upper portion of the substrate SL may be patterned to form the first trenches TR1 extending in the second direction D2. The first trenches TR1 may define the first and second active patterns FN1 and FN2 in the upper portion of the substrate SL. The first and second active patterns FN1 and FN2 may be arranged in the first direction D1. An upper portion of the substrate SL may be patterned to form the second trenches TR2 defining the first active regions PR1 and PR2 and the second active regions NR1 and NR2. The active patterns FN1 and FN2 overlapping the second trenches TR2 may be removed during the formation of the second trench TR2. The second trenches TR2 may be formed to be deeper than the first trenches TR1, but in some embodiments, they may be formed to have a depth equal to a depth of the first trenches TR1. The device isolation layer ST may be formed to fill the first and second trenches TR1 and TR2. The device isolation layer ST may be formed of or include silicon oxide. The material filling the first trench TR1 may be the same as the material filling the second trench TR2, but the inventive concept is not limited to this example; that is, the first and second trenches TR1 and TR2 may be formed with different materials.

Sacrificial patterns PP may be formed to cross the first and second active patterns FN1 and FN2. The sacrificial patterns PP may be line- or bar-shaped patterns extending in the first direction D1. In detail, the formation of the sacrificial patterns PP may include forming a sacrificial layer on the substrate SL, forming hard mask patterns MA on the sacrificial layer, and patterning the sacrificial layer using the hard mask patterns MA as an etch mask. The sacrificial layer may include, for example, a poly-silicon layer.

A pair of the gate spacers GS may be formed on opposing side surfaces of each of the sacrificial patterns PP. The gate spacers GS may be formed on opposing side surfaces of each of the first and second active patterns FN1 and FN2. The formation of the gate spacers GS may include conformally forming a gate spacer layer on the substrate SL and anisotropically etching the gate spacer layer. The gate spacer layer may be formed of or include at least one of SiCN, SiCON, or SiN. In some embodiments, the gate spacer layer may include at least two layers, each of which is formed of at least one of SiCN, SiCON, or SiN; that is, the gate spacer layer may have a multi-layered structure.

The first source/drain regions SD1 may be formed on the first active patterns FN1. The second source/drain regions SD2 may be formed on the second active patterns FN2. The first source/drain regions SD1 may be regions that are doped with p-type impurities, and the second source/drain regions SD2 may be regions that are doped with n-type impurities.

The first and second source/drain regions SD1 and SD2 may be epitaxial patterns, which are formed by a selective epitaxial growth process. In detail, the first and second active patterns FN1 and FN2 may be partially recessed, and an epitaxial growth process may be performed on the recessed regions of the first and second active patterns FN1 and FN2. The first upper insulating layer UIL1 may be formed to cover the first and second source/drain regions SD1 and SD2.

Figure 13A:
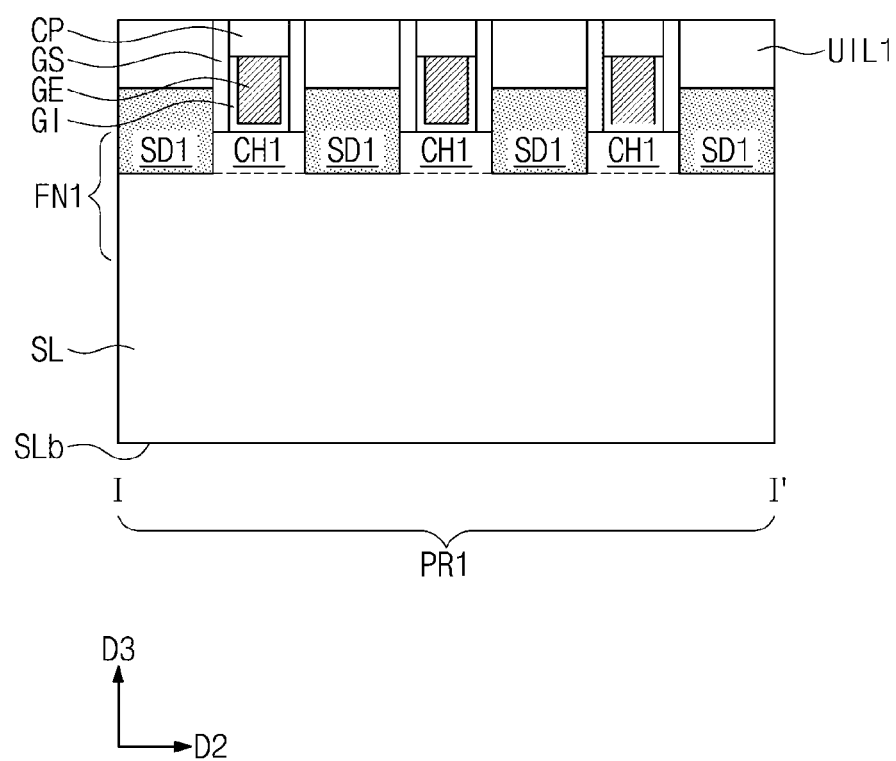
Figure 13B:
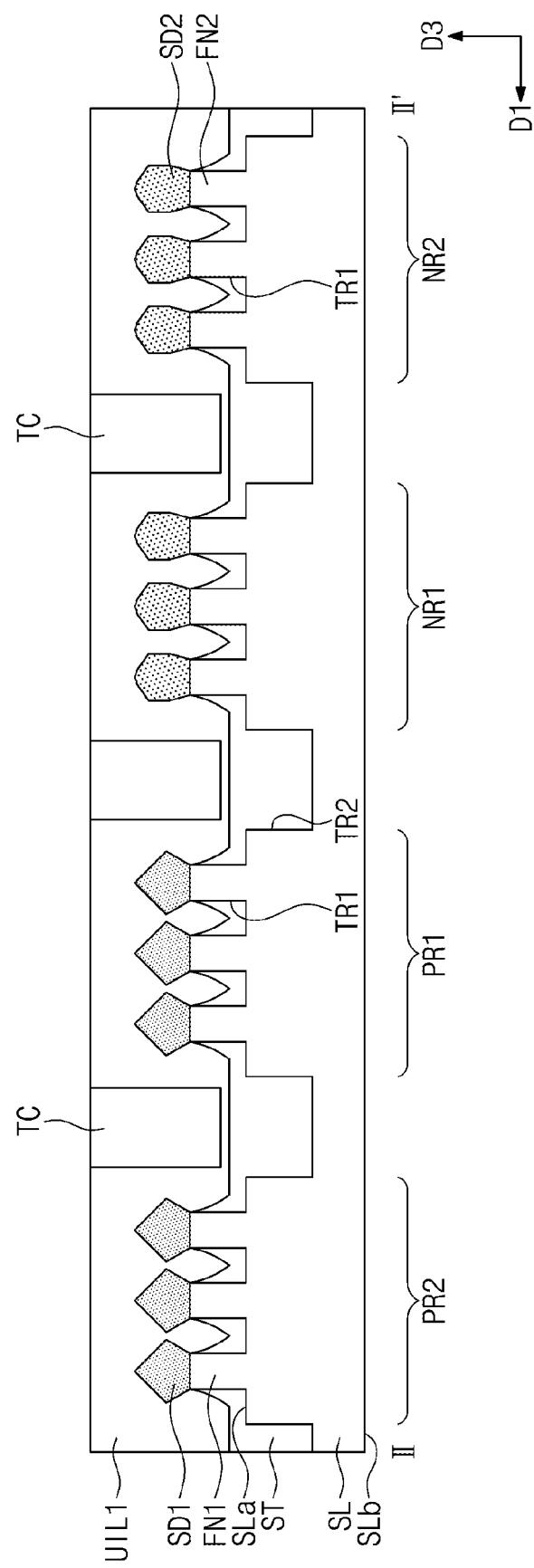
Figure 13C:
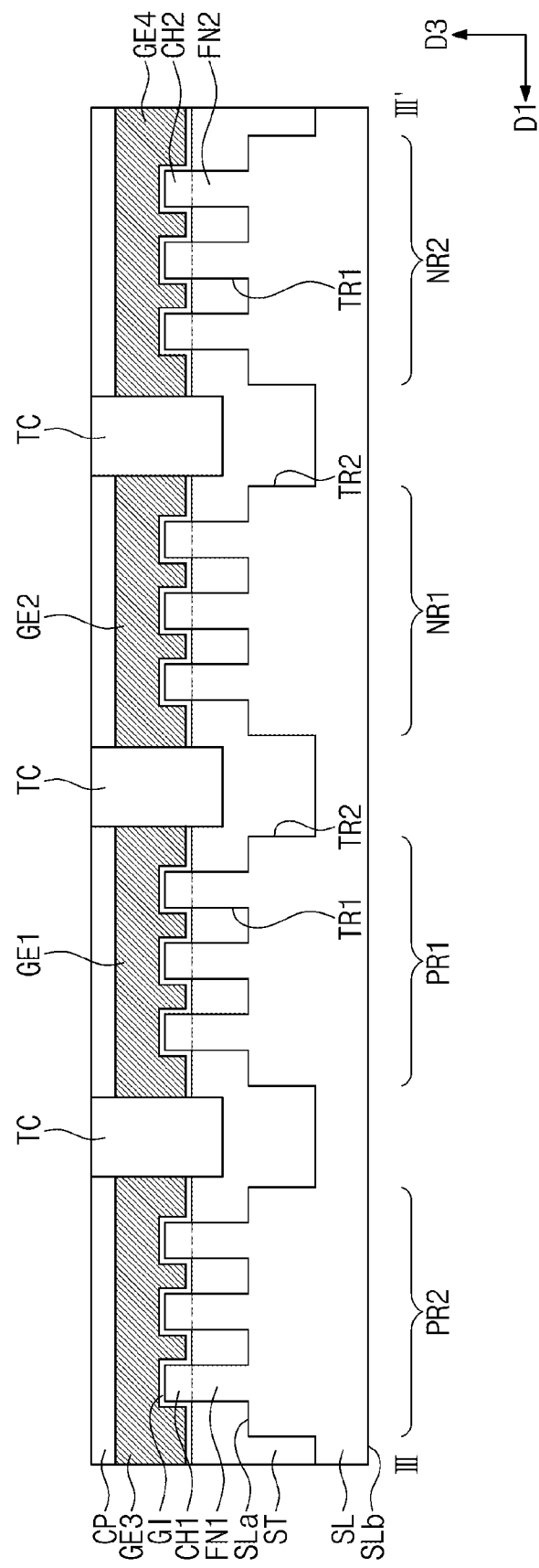

Referring to FIGS. 13A to 13C, a planarization process on the first upper insulating layer UIL1 may be performed to expose top surfaces of the sacrificial patterns PP. Each of the sacrificial patterns PP may be replaced with the gate electrode GE and the gate dielectric layer GI. In detail, the exposed sacrificial patterns PP may be selectively removed to form an empty space (e.g., opening). The gate dielectric layer GI may be formed in the empty space, which is formed by removing the sacrificial pattern PP. The gate electrode GE may be formed to fill the empty space on the gate dielectric layer GI.

The gate dielectric layer GI may be conformally formed by an atomic layer deposition (ALD) process and/or a chemical oxidation process. The gate electrode GE may be formed by forming a gate electrode layer on the gate dielectric layer GI and planarizing the gate electrode layer. The gate electrode layer may include a first metal layer, a second metal layer, and an upper conductive layer. As an example, the first metal layer may be formed of or include at least one of conductive metal nitrides. The second metal layer may be formed of or include at least one of aluminum compounds. The upper conductive layer may be formed of or include at least one of materials having resistivity lower than the first and second metal layers.

An upper portion of the gate electrode GE may be selectively etched, and the gate capping layer CP may be formed on the recessed gate electrode GE. The formation of the gate capping layer CP may include forming an insulating layer to cover the recessed gate electrode GE and planarizing the insulating layer to expose a top surface of the first upper insulating layer UIL1. As an example, the gate capping layer CP may be formed of or include at least one of SiON, SiCN, SiCON, or SiN.

The insulating separation patterns TC may be formed to divide the gate electrode GE, which is extended in the first direction D1, into a plurality of gate electrodes. The insulating separation patterns TC may be formed after the replacing the sacrificial patterns PP with the gate electrodes GE. In some embodiments, the insulating separation patterns TC may be formed to penetrate the gate dielectric layer GI. The first to fourth gate electrodes GE1 to GE4, which are separated from each other in the first direction D1, may be formed by the insulating separation patterns TC. In some embodiments, the insulating separation patterns TC may be formed before the replacing the sacrificial patterns PP with the gate electrodes GE. The sacrificial patterns PP, which are separated from each other in the first direction D1 by the insulating separation patterns TC, may be replaced with the first to fourth gate electrodes GE1 to GE4, respectively. In this case, the gate dielectric layer GI may be formed along the side surfaces of the insulating separation patterns TC, as shown in FIG. 6.

Figure 14A:
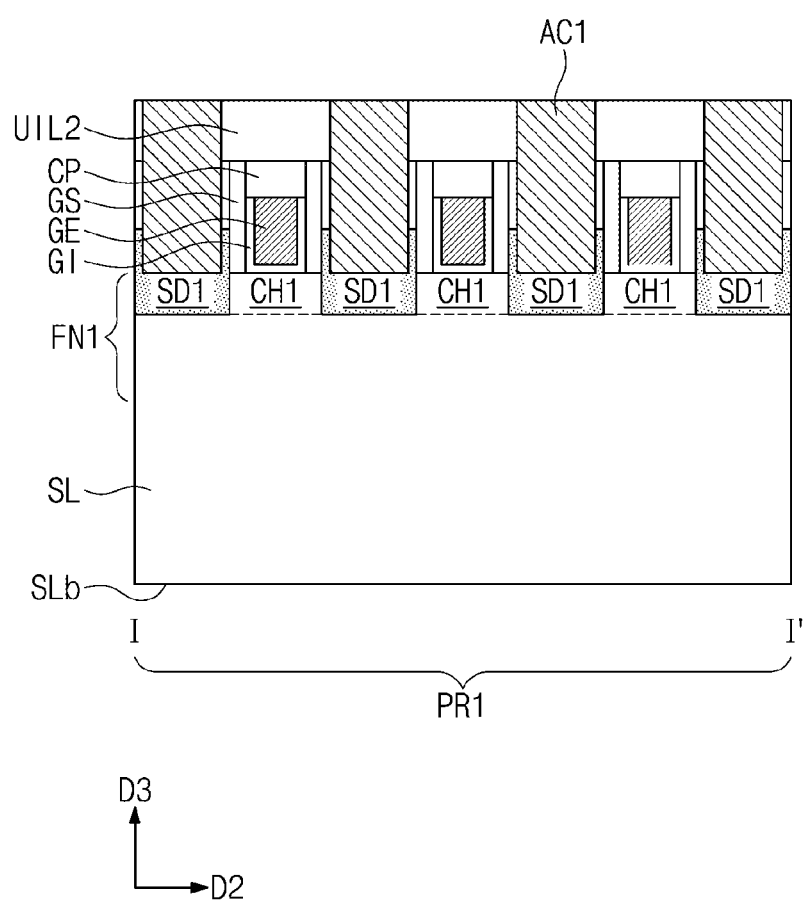
Figure 14B:
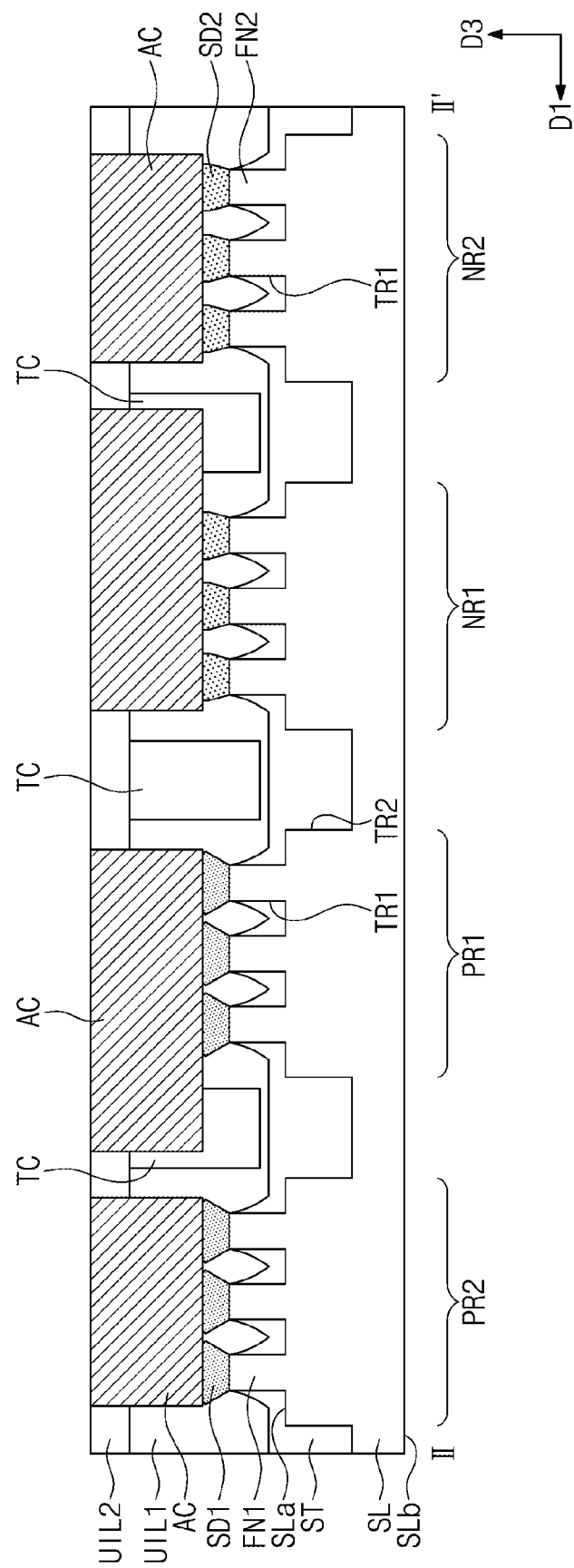
Figure 14C:
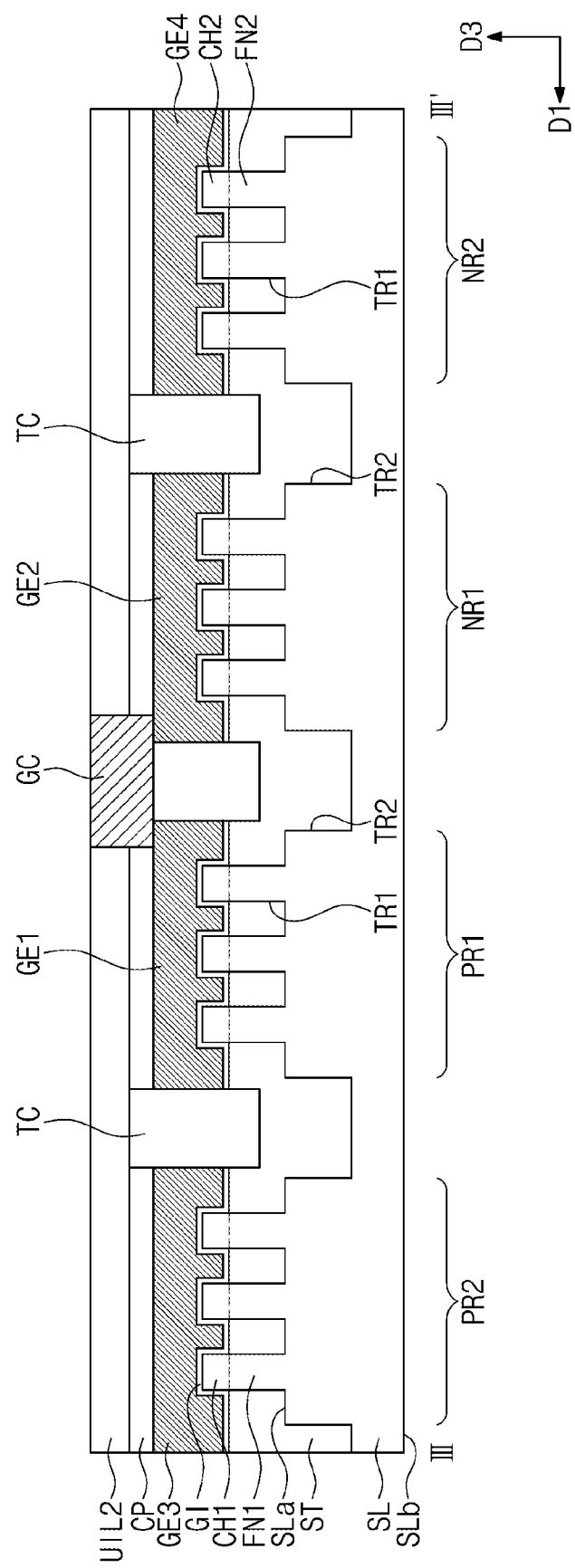

Referring to FIGS. 14A to 14C, the second upper insulating layer UIL2 may be formed on the first upper insulating layer UIL1. The active contacts AC may be formed to penetrate the first and second upper insulating layers UIL1 and UIL2. The active contacts AC may be connected to the first and second source/drain regions SD1 and SD2. The gate contact GC may be formed to penetrate the second upper insulating layer UIL2 and the gate capping layer CP. The gate contact GC may be connected to the gate electrodes GE. The formation of each of the active and gate contact AC and GC may include forming a barrier pattern and forming a conductive pattern on the barrier pattern. As an example, the barrier pattern may be formed of or include at least one of metal nitrides (e.g., titanium nitride or tungsten nitride), and the conductive pattern may be formed of or include at least one of metallic materials (e.g., titanium or tungsten).

Referring back to FIGS. 2 to 4, the third upper insulating layer UIL3 and the fourth upper insulating layer UIL4 may be formed on the second upper insulating layer UIL2. The first upper interconnection lines UML1 may be formed in the third upper insulating layer UIL3, and the second upper interconnection lines UML2 may be formed in the fourth upper insulating layer UIL4. The first and second upper interconnection lines UML1 and UML2, along with the upper vias UVI thereunder, may be formed by a damascene process. The first upper interconnection lines UML1 may include the first power rail POR1, the second power rail POR2, and the first intermediate line MO1. Although not shown, a plurality of metal layers may be additionally stacked on the fourth upper insulating layer UIL4.

Figure 15A:
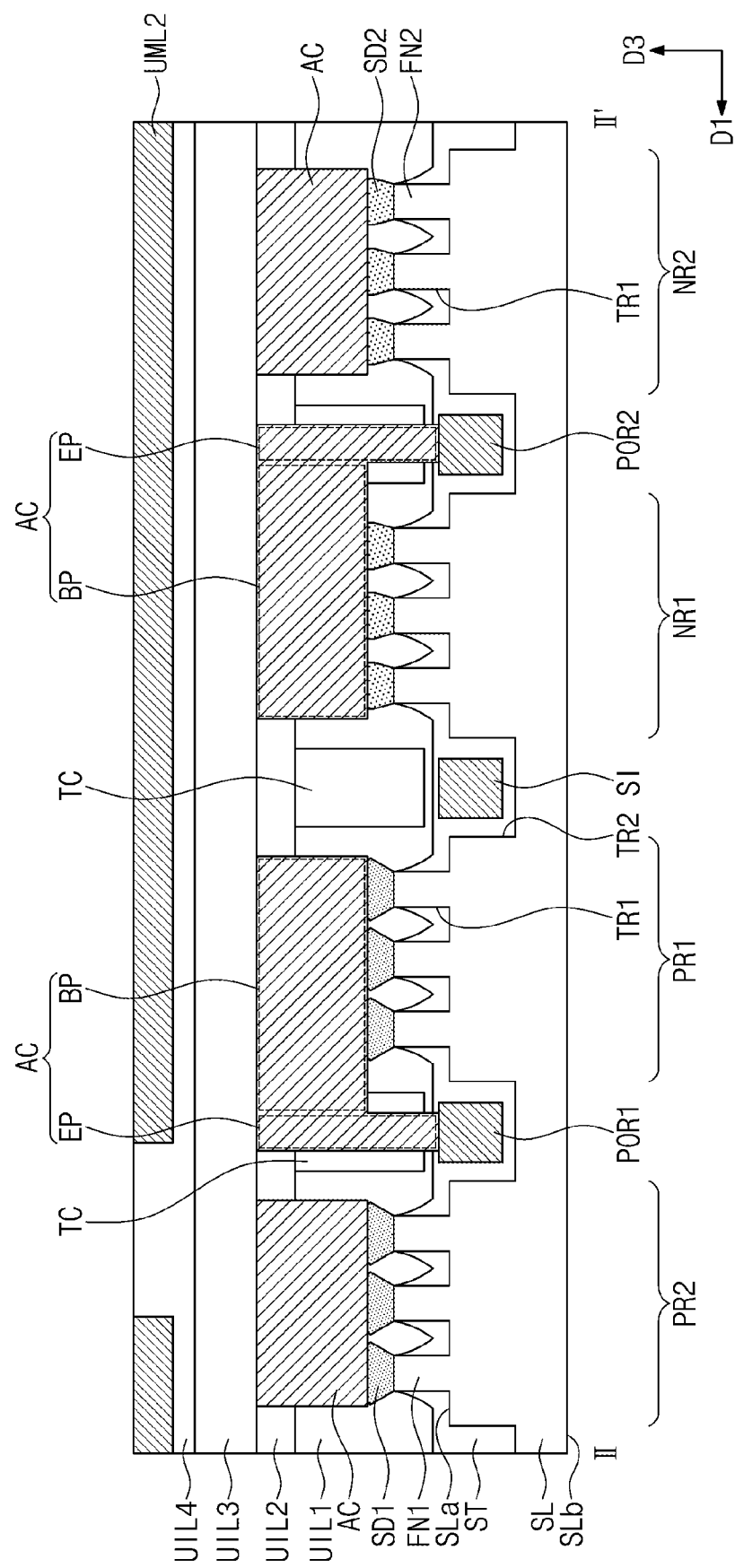
FIGS. 15A and 15B are cross-sectional views illustrating a semiconductor device according to some embodiments of the inventive concept, taken along the lines II-II' and III-III' of FIG. 1.
Figure 15B:
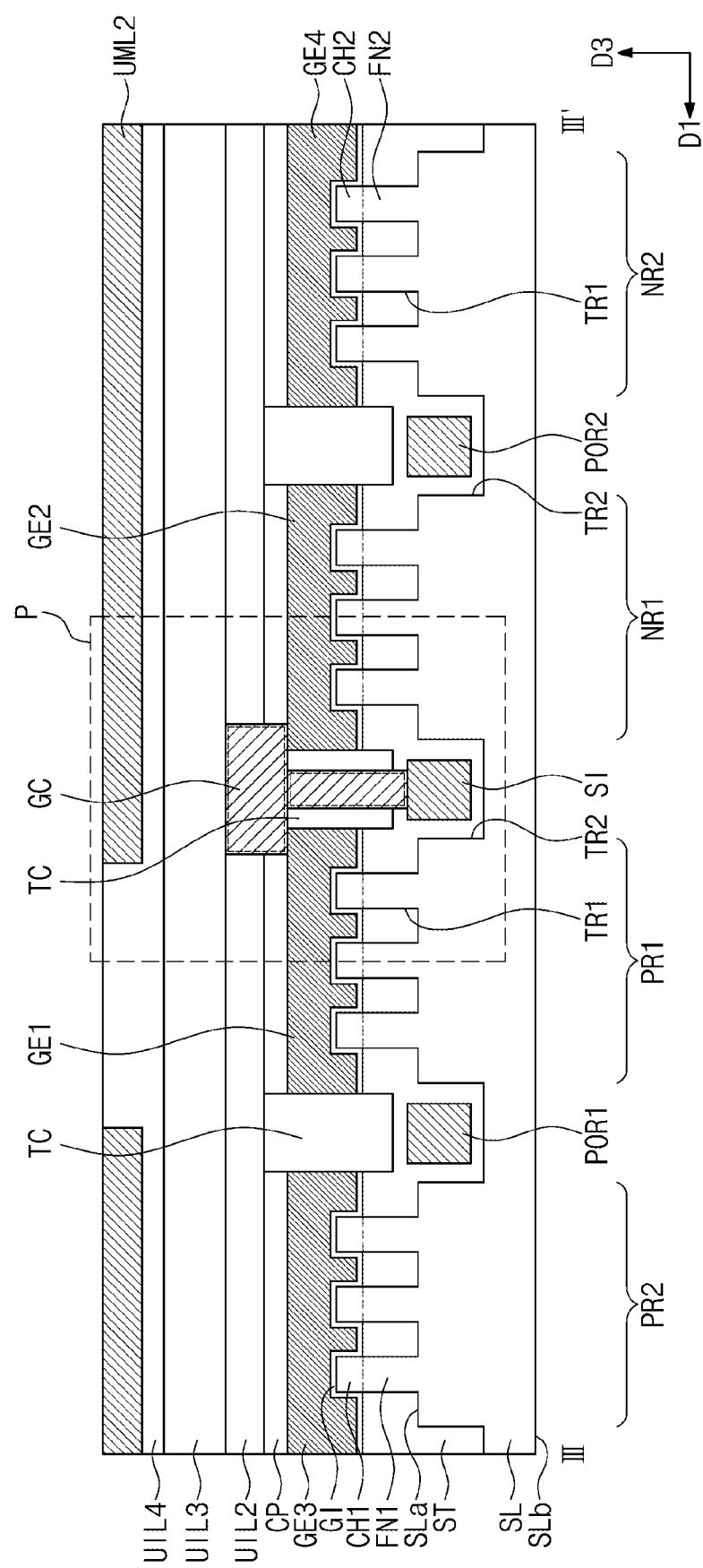
Figure 16:
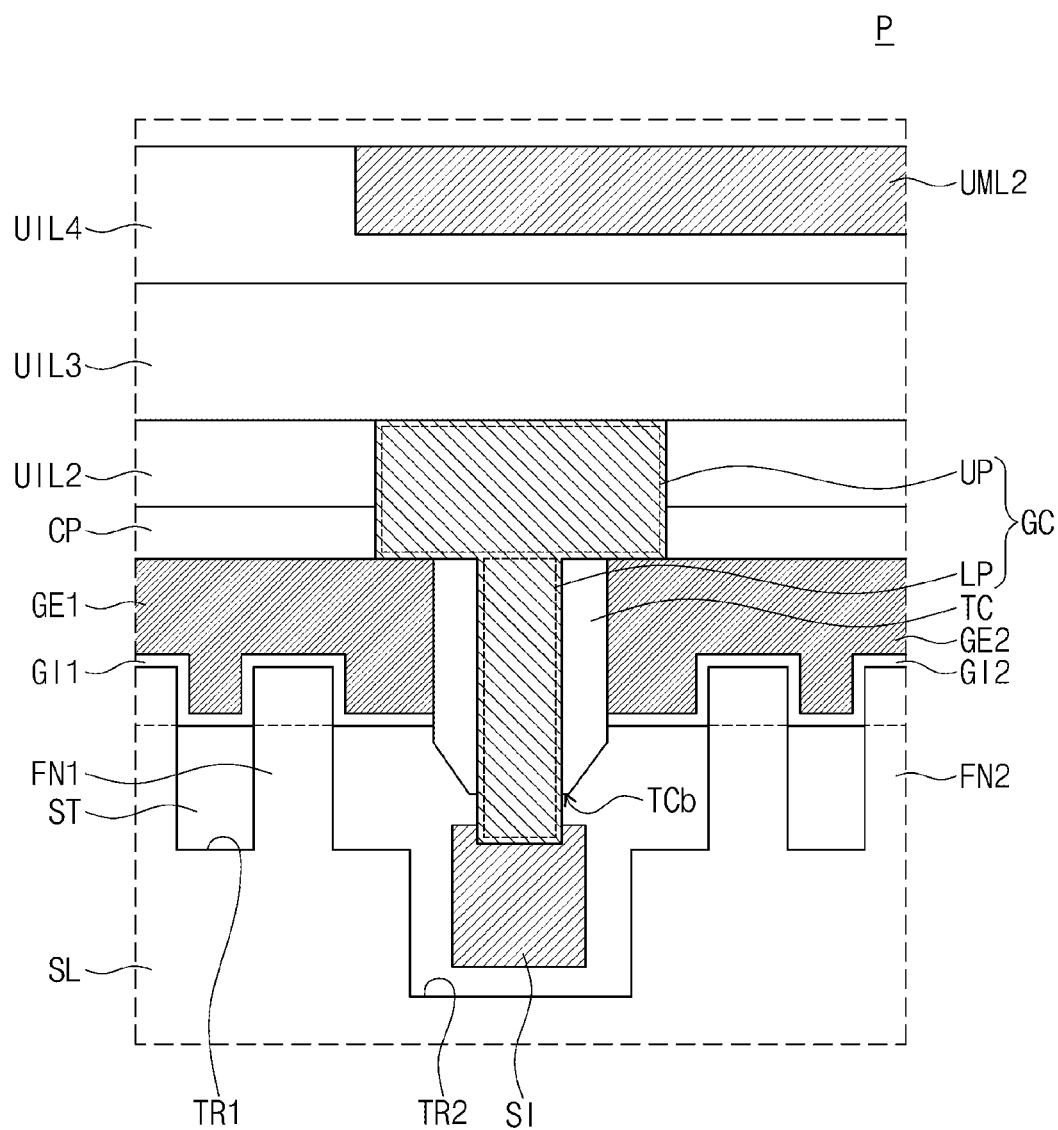
FIG. 16 is an enlarged view of the region P of FIG. 15B.

FIGS. 15A and 15B are cross-sectional views illustrating a semiconductor device according to some embodiments of the inventive concept, taken along the lines II-II' and III-III' of FIG. 1. FIG. 16 is an enlarged view of the region P of FIG. 15B. For concise description, previously described elements may be identified by the same reference numbers without repeating an overlapping description thereof.

Referring to FIGS. 15A, 15B, and 16, the first or second power rail POR1 or POR2 and the first signal line SI may be provided in the device isolation layer ST. Hereinafter, these conductive lines provided in the device isolation layer ST will be referred to as buried lines. The buried lines may be formed by a process of forming trenches in the device isolation layer ST and filling the trenches with a conductive material. Thereafter, an insulating layer may be formed on the buried lines to fill the remaining regions of the trenches.

The bottom surface TCb of the insulating separation pattern TC may be spaced apart from a top surface of the buried line, but in some embodiments, the bottom surface TCb of the insulating separation pattern TC may be in contact with the top surface of the buried line.

At least one active contact AC may be electrically connected to the first power rail POR1 or the second power rail POR2. Each of such active contacts AC may include a body portion BP and an extended portion EP. The body portion BP may be provided on and electrically connected to the first source/drain regions SD1 or the second source/drain regions SD2. At least a portion of the extended portion EP may be vertically overlapped with the first power rail POR1 or the second power rail POR2. The extended portion EP may be vertically extended from the body portion BP toward the first power rail POR1 or the second power rail POR2. Accordingly, the extended portion EP may be in contact with the first power rail POR1 or the second power rail POR2. The extended portion EP may be provided to penetrate the insulating separation pattern TC and the device isolation layer ST and may be connected to the first power rail POR1 or the second power rail POR2.

At least one gate contact GC may be electrically connected to the first signal line SI. Each of such gate contacts GC may include an upper contact UP and a lower contact LP. In some embodiments, a bottom surface of the upper contact UP may be in common contact with the top surfaces of the first and second gate electrodes GE1 and GE2. The lower contact LP may penetrate the insulating separation pattern TC and may be in contact with an upper portion of the first signal line SI.

FIGS. 17 to 20 are enlarged views illustrating the region P of FIG. 15B, according to some embodiments of the inventive concept. The inventive concept is not limited to the embodiments illustrated in FIGS. 16 through 20, and features of those embodiments of FIGS. 16 to 20 can be combined.

Figure 17:
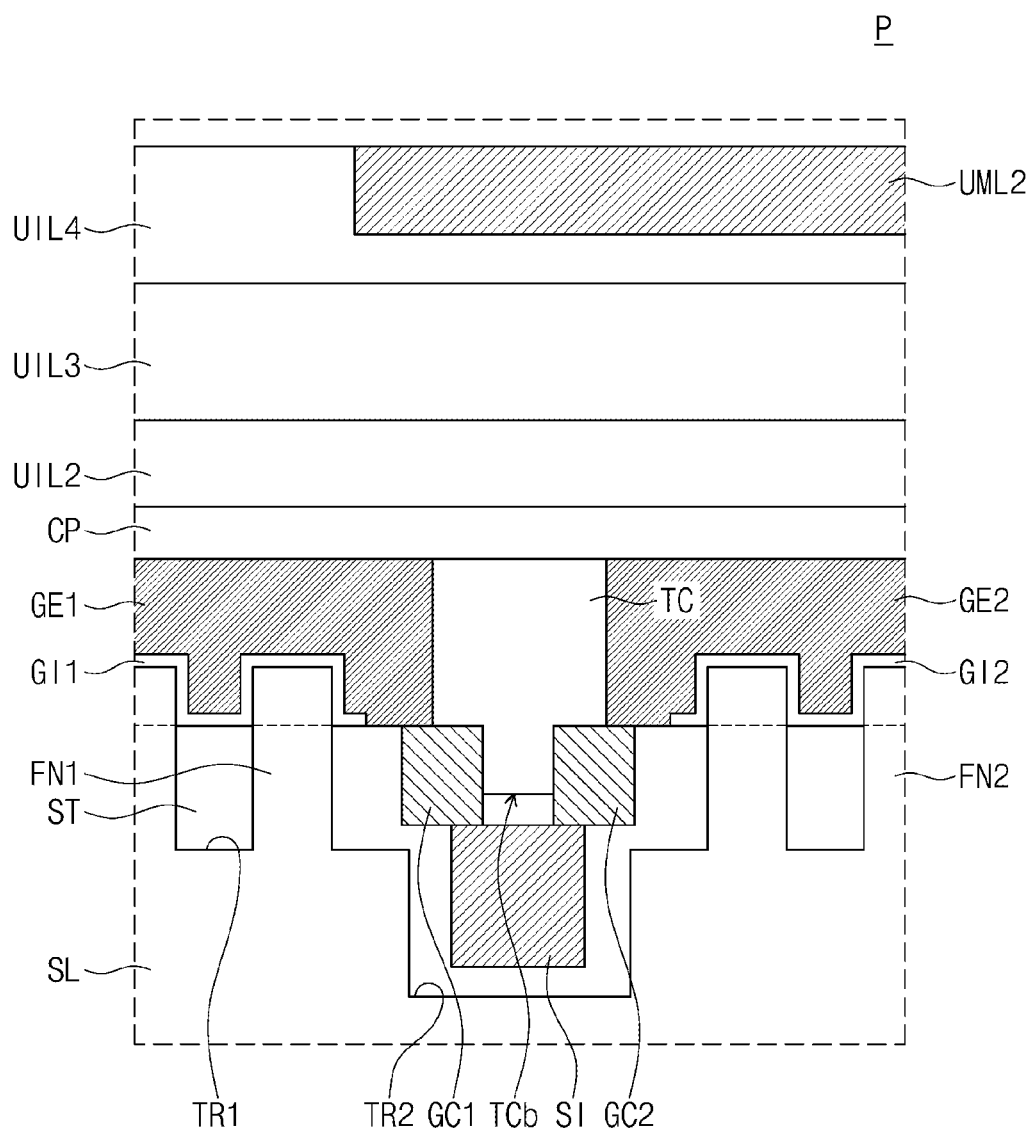
FIGS. 17 to 20 are enlarged views illustrating the region P of FIG. 15B, according to some embodiments of the inventive concept.

Referring to FIG. 17, the first and second gate electrodes GE1 and GE2 may be connected to the first signal line SI through first and second gate contacts GC1 and GC2, respectively, which are disposed below them. As an example, the first and second gate contacts GC1 and GC2 may be provided in the device isolation layer ST. Upper portions of the first and second gate contacts GC1 and GC2 may be connected to a lower portion of the insulating separation pattern TC. The first gate dielectric layer GI1 may not be provided between the first gate contact GC1 and the first gate electrode GE1. The second gate dielectric layer GI2 may not be provided between the second gate contact GC2 and the second gate electrode GE2. This shape of the first and second gate dielectric layers GI1 and GI2 may be realized by removing portions of the first and second gate dielectric layers GI1 and GI2, before the formation of the first and second gate electrodes GE1 and GE2.

Figure 18:
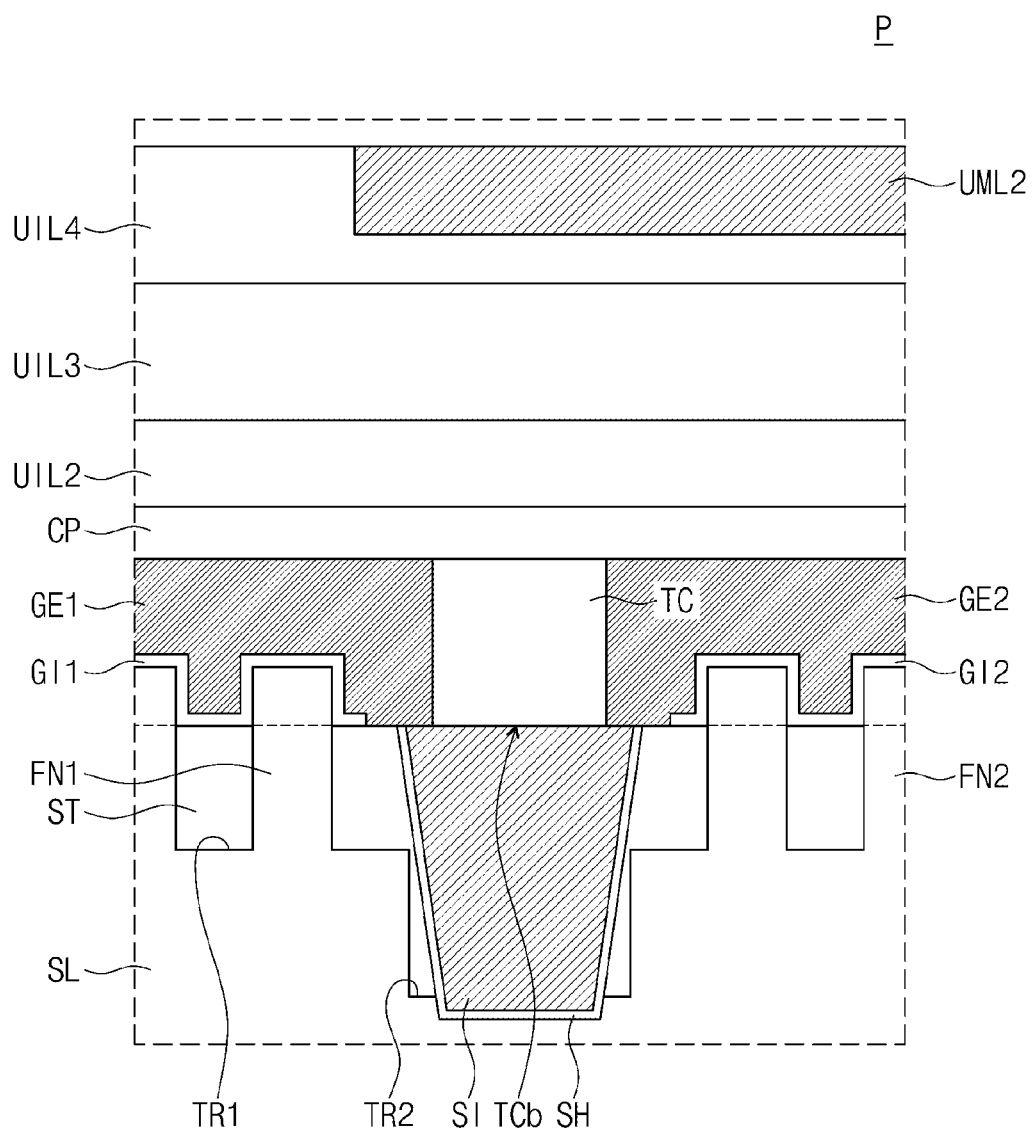

Referring to FIG. 18, the bottom surface of the first gate electrode GE1 and the bottom surface of the second gate electrode GE2 may be connected to the top surface of the first signal line SI. The bottom surface TCb of the insulating separation pattern TC may be connected to the top surface of the first signal line SI. The first signal line SI may penetrate the device isolation layer ST and may be inserted into an upper portion of the substrate SL. A bottom surface of the first signal line SI may be lower than the bottommost surface of the device isolation layer ST. In this case, an insulating gapfill layer SH may be provided to cover the side and bottom surfaces of the first signal line SI. As an example, the insulating gapfill layer SH may be formed of or include at least one of silicon oxide, silicon nitride, or silicon oxynitride. In some embodiments, the bottom surface of the first signal line SI may be located at a level higher than the bottom surface of the second trench TR2.

Figure 19:
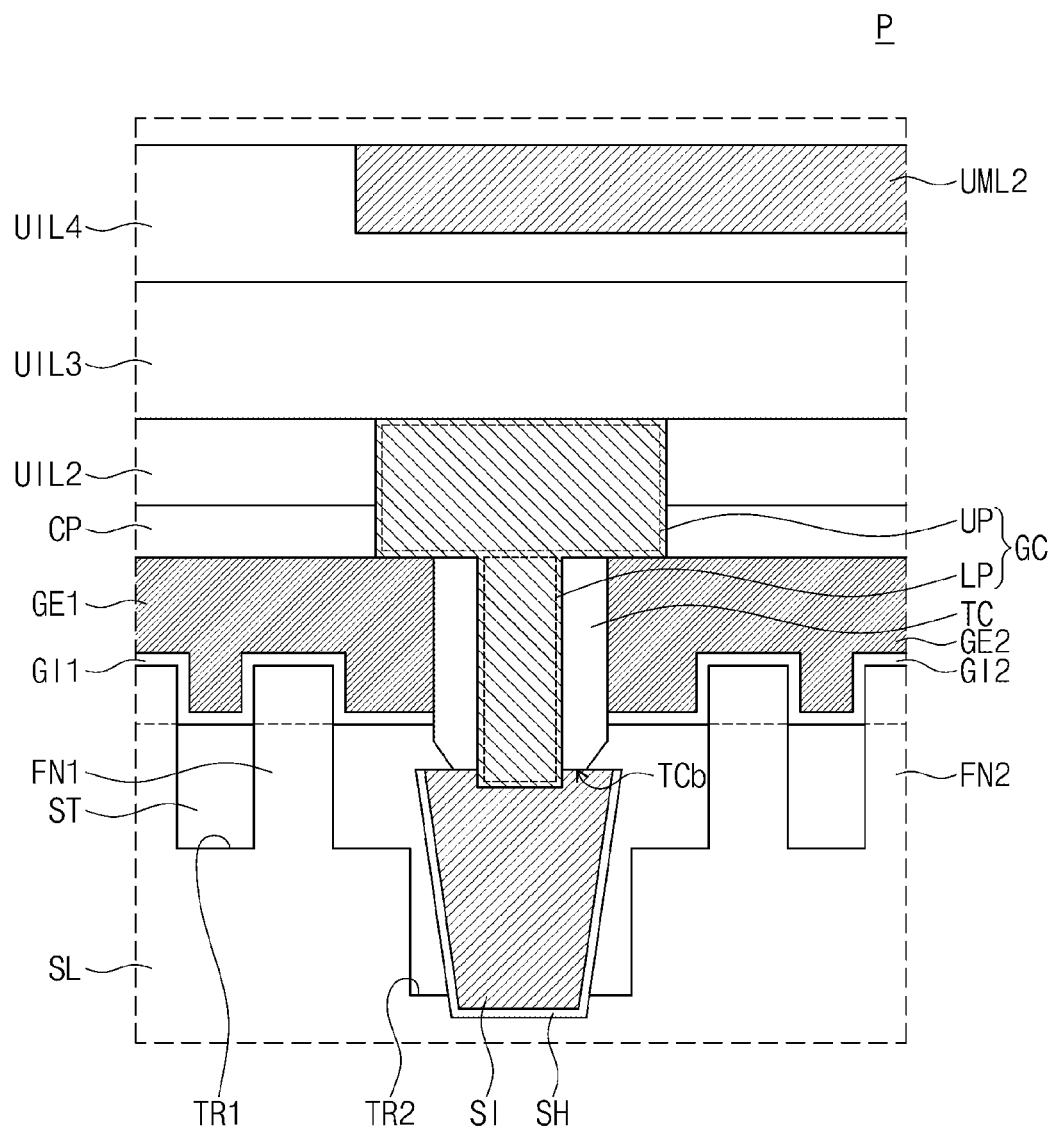

Referring to FIG. 19, the gate contact GC may include the upper contact UP and the lower contact LP. As an example, the bottom surface of the upper contact UP may be in common contact with the top surface of the first gate electrode GE1 and the top surface of the second gate electrode GE2. The lower contact LP may penetrate the insulating separation pattern TC and may be connected to an upper portion of the first signal line SI. A bottom surface of the insulating separation pattern TC may be in contact with the first signal line SI. The first signal line SI may penetrate the device isolation layer ST and may be inserted into an upper portion of the substrate SL. The insulating gapfill layer SH may be provided to cover the side and bottom surfaces of the first signal line SI.

Figure 20:
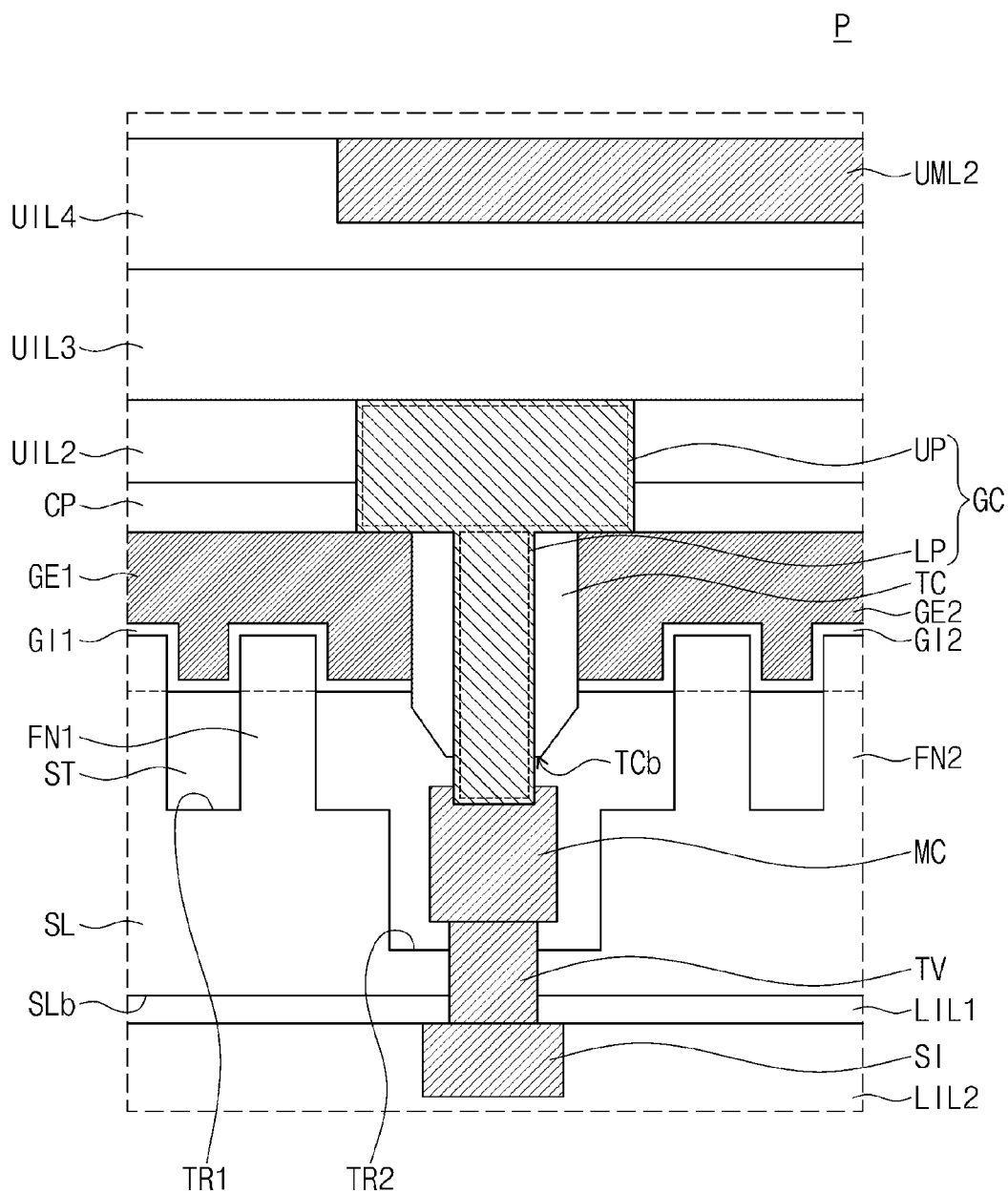

Referring to FIG. 20, the gate contact GC including the upper contact UP and the lower contact LP may be provided. The first signal line SI may be provided on the second surface SLb of the substrate SL. As an example, a first lower insulating layer LIL1 and a second lower insulating layer LIL2 may be provided on the second surface SLb of the substrate SL, and the first signal line SI may be provided in the second lower insulating layer LIL2. The first signal line SI may be connected to the gate contact GC through a through via TV penetrating the substrate SL. As an example, a buried contact MC may be provided between the through via TV and the lower contact LP, but in some embodiments, the buried contact MC may be omitted and the through via TV may be directly connected to the gate contact GC.

Although not shown, a power distribution network, which is connected to the first power rail POR1 and the second power rail POR2, may be provided on the second surface SLb, and in this case, the first signal line SI may be provided at the same level as the power distribution network. As an example, interconnection lines constituting the power distribution network may be provided in the second lower insulating layer LIL2 and may be formed together with the first signal line SI.

According to some embodiments of the inventive concept, it may be possible to reduce a parasitic capacitance of a semiconductor device. In addition, it may be possible to reduce a cell height and thereby to reduce an occupying area of the semiconductor device. In the semiconductor device, it may be possible to prevent diffusion of a gate material, which may occur when gates of different conductivity types are in direct contact with each other, and thereby to suppress a variation in threshold voltage of the semiconductor device.

While example embodiments of the inventive concept have been particularly shown and described, it will be understood by one of ordinary skill in the art that illustrated embodiments are illustrative, and not restrictive, and the appended claims are intended to cover all modifications, enhancements, and other embodiments, which fall within the scope of the inventive concept.

What is claimed is:

1. A semiconductor device comprising:
    a substrate including a first region and a second region, which are spaced apart from each other with a device isolation layer interposed therebetween;
    a first gate electrode and a second gate electrode, which are respectively on the first region and the second region, extend in a first direction, and are aligned with each other in the first direction;
    an insulating separation pattern separating the first gate electrode and the second gate electrode from each other and extending in a second direction that traverses the first direction;
    a connection structure electrically connecting the first gate electrode to the second gate electrode; and
    a first signal line electrically connected to the connection structure,
    wherein the first signal line extends in the second direction and vertically overlaps the insulating separation pattern.

2. The semiconductor device of claim 1, wherein the connection structure comprises a gate contact, and
    a bottom surface of the gate contact contacts a top surface of the first gate electrode and a top surface of the second gate electrode.

3. The semiconductor device of claim 2, wherein the bottom surface of the gate contact is in contact with a top surface of the insulating separation pattern.

4. The semiconductor device of claim 2, wherein a width of the gate contact in the first direction is larger than a width of the insulating separation pattern in the first direction.

5. The semiconductor device of claim 4, wherein the width of the gate contact in the first direction is about 1.2 to 2 times the width of the insulating separation pattern in the first direction.

6. The semiconductor device of claim 2, wherein a width of the gate contact in the first direction is larger than a width of the first signal line in the first direction.

7. The semiconductor device of claim 1, wherein the first signal line is in the device isolation layer.

8. The semiconductor device of claim 7, wherein the connection structure comprises a gate contact, and
    the gate contact comprises:
        an upper contact on the insulating separation pattern; and
        a lower contact extending through the insulating separation pattern,
    wherein the lower contact is connected to an upper portion of the first signal line.

9. The semiconductor device of claim 7, wherein a bottom surface of the first signal line is lower than a bottommost end of the device isolation layer.

10. The semiconductor device of claim 1, wherein the substrate comprises a first surface and a second surface opposing each other,
the first surface of the substrate faces the first and second gate electrodes, and
the second surface of the substrate faces the first signal line.

11. The semiconductor device of claim 10, wherein the connection structure comprises a gate contact and a penetration electrode, and
the penetration electrode extends through the substrate and connects the gate contact to the first signal line.

12. The semiconductor device of claim 1, wherein the insulating separation pattern is in contact with a side surface of the first gate electrode and a side surface of the second gate electrode and protrudes into the device isolation layer.

13. The semiconductor device of claim 1, wherein the insulating separation pattern comprises a lower pattern connected to the device isolation layer and an upper pattern on the lower pattern, and
the upper pattern comprises a material different from the lower pattern.

14. The semiconductor device of claim 1, wherein the first region comprises first active patterns,
the second region comprises second active patterns,
the substrate comprises first trenches between the first active patterns and between the second active patterns and a second trench between the first region and the second region, and
a bottom surface of the insulating separation pattern is at a level lower than a bottom surface of the second trench relative to the substrate.

15. The semiconductor device of claim 1, further comprising:
a third region, which is spaced apart from the second region with the first region interposed therebetween and has a conductivity type different from the first region; and
a third gate electrode on the third region,
wherein the third gate electrode extends in the first direction and is aligned with the first and second gate electrodes in the first direction, and
a distance between the first gate electrode and the third gate electrode is larger than a distance between the first gate electrode and the second gate electrode.

16. The semiconductor device of claim 1, further comprising:
a first source/drain region adjacent a first side of the first gate electrode;
a second source/drain region adjacent a first side of the second gate electrode;
a first active contact and a second active contact on the first source/drain region and the second source/drain region, respectively; and
a second signal line electrically connecting the first and second source/drain regions to each other through the first and second active contacts.

17. The semiconductor device of claim 1, wherein the first signal line is in the device isolation layer, and
the connection structure comprises a first gate contact below the first gate electrode and a second gate contact below the second gate electrode.

18. A semiconductor device, comprising:
a substrate including a first region and a second region, which are spaced apart from each other with a device isolation layer interposed therebetween;
a first gate electrode and a second gate electrode, which are respectively on the first region and the second region, are extended in a first direction, and are aligned with each other in the first direction, the first gate electrode comprising a first side and a second side that are opposing each other, and the second gate electrode comprising a first side and a second side that are opposing each other;
an insulating separation pattern separating the first gate electrode and the second gate electrode from each other and extending in a second direction that traverses the first direction;
a connection structure electrically connecting the first gate electrode to the second gate electrode;
a first signal line electrically connected to the connection structure;
a first source/drain region adjacent the first side of the first gate electrode;
a second source/drain region adjacent the first side of the second gate electrode;
a first active contact and a second active contact on the first source/drain region and the second source/drain region, respectively;
a second signal line electrically connecting the first and second source/drain regions to each other, through the first and second active contacts;
a third source/drain region adjacent the second side of the first gate electrode;
a fourth source/drain region adjacent the second side of the second gate electrode;
a first power rail electrically connected to the third source/drain region and extends in the second direction; and
a second power rail electrically connected to the fourth source/drain region and extends in the second direction,
wherein the first signal line extends in the second direction and vertically overlaps the insulating separation pattern.

19. A semiconductor device comprising:
a unit cell comprising:
a first active region and a second active region spaced apart from each other in a cell height direction;
a first gate electrode and a second gate electrode vertically overlapping the first active region and second active region, respectively, wherein the first gate electrode and the second gate electrode are spaced apart from each other in the cell height direction and are colinear along the cell height direction;
a connection structure that electrically connects the first gate electrode and the second gate electrode and vertically overlaps a portion of the first gate electrode and a portion of the second gate electrode; and
a signal line electrically connected to the connection structure, wherein the signal line extends in a cell width direction and is between the first gate electrode and the second gate electrode in a plan view.

20. The semiconductor device of claim 19, wherein the connection structure contacts the portion of the first gate electrode and the portion of the second gate electrode.

* * * * *